United States Patent
Asai et al.

(10) Patent No.: US 11,552,109 B2
(45) Date of Patent: Jan. 10, 2023

(54) CIRCUIT SUBSTRATE AND DISPLAY DEVICE

(71) Applicant: Sharp Kabushiki Kaisha, Sakai (JP)

(72) Inventors: Yoshihiro Asai, Sakai (JP); Satoshi Horiuchi, Sakai (JP); Seiya Kawamorita, Sakai (JP); Shinji Matsubara, Sakai (JP); Seijirou Gyouten, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 83 days.

(21) Appl. No.: 17/151,837

(22) Filed: Jan. 19, 2021

(65) Prior Publication Data

US 2021/0225879 A1    Jul. 22, 2021

Related U.S. Application Data

(60) Provisional application No. 62/963,587, filed on Jan. 21, 2020.

(51) Int. Cl.
*G02F 1/1362* (2006.01)
*H01L 27/12* (2006.01)

(52) U.S. Cl.
CPC ...... *H01L 27/124* (2013.01); *G02F 1/136286* (2013.01)

(58) Field of Classification Search
CPC .................................................... H01L 27/124
See application file for complete search history.

(56) References Cited

U.S. PATENT DOCUMENTS

| 2012/0327057 A1* | 12/2012 | Sakamoto | G11C 19/184 345/211 |
| 2017/0178563 A1* | 6/2017 | Anzai | G09G 3/3275 |
| 2020/0006452 A1* | 1/2020 | Lee | H01L 27/0288 |

FOREIGN PATENT DOCUMENTS

JP    2009-122636 A    6/2009

\* cited by examiner

*Primary Examiner* — Sang V Nguyen
(74) *Attorney, Agent, or Firm* — Keating & Bennett, LLP

(57) ABSTRACT

A circuit substrate includes a substrate portion having a variable-external-shape portion; a circuit portion, having a configuration in which circuit blocks adjacent to each other in a first direction; a plurality of trunk wiring lines bent along the circuit blocks displaced with respect to each other in a second direction; and a plurality of branch wiring lines, wherein the plurality of trunk wiring lines include a first trunk wiring line and a second trunk wiring line, and among the plurality of branch wiring lines, a plurality of branch wiring lines connected to a plurality of unit circuits constituting a center-side circuit block include at least a first branch wiring line connected to the first trunk wiring line and a second branch wiring line connected to the second trunk wiring line and disposed farther than the first branch wiring line from a end-side circuit block in the first direction.

10 Claims, 11 Drawing Sheets

CIRCUIT SUBSTRATE AND DISPLAY DEVICE

CROSS-REFERENCE TO RELATED APPLICATION

The present application claims priority from Provisional Application No. 62/963,587, the content to which is hereby incorporated by reference into this application.

BACKGROUND

1. Field

The techniques disclosed in this description relate to a circuit substrate and a display device.

2. Description of the Related Art

Hitherto, as an example of an element substrate of an electrooptical device, the element substrate described in Japanese Unexamined Patent Application Publication No. 2009-122636 has been known. In the element substrate of the electrooptical device described in Japanese Unexamined Patent Application Publication No. 2009-122636, a pixel region has an odd-shaped outer peripheral portion formed of a curved portion at a portion opposed to a scanning line driving circuit. In the scanning line driving circuit, in accordance with such a shape, circuit blocks each having a unit circuit block including one or a plurality of unit circuits are aligned along an outer peripheral edge of the pixel region in such a manner that the circuit blocks are displaced with respect to each other in a scanning line extending direction and/or a data line extending direction. As the unit circuit blocks, one type of unit circuit blocks having the same planar configuration are used.

The element substrate described in the above-mentioned Japanese Unexamined Patent Application Publication No. 2009-122636 is provided with wiring lines for connecting the circuit blocks to each other, and a wiring line routing region is disposed around the circuit blocks. In recent years, the number of wiring lines that are installed has been increasing in accordance with an increase in the resolution or size of electrooptical devices, and extension of a line width has been demanded. Thus, it has been difficult to keep the frame width of element substrates small.

SUMMARY

An aspect of the techniques described in the description of the present application have been completed on the basis of the above-described circumstances and are directed to decreasing a frame width.

(1) A circuit substrate related to an aspect of a technique described in the description of the present application includes: a substrate portion having a variable-external-shape portion whose external dimension in a second direction orthogonal to a first direction varies according to a position in the first direction; a circuit portion formed of a plurality of circuit blocks arranged adjacent to each other in the first direction, each of the plurality of circuit blocks including a plurality of unit circuits arranged adjacent to each other in the first direction in the substrate portion, the circuit portion having a configuration in which circuit blocks adjacent to each other in the first direction among the plurality of circuit blocks are displaced with respect to each other in the second direction in accordance with variation in the external dimension of the variable-external-shape portion; a plurality of trunk wiring lines that are disposed so as to be sandwiched between the circuit portion and the variable-external-shape portion in the substrate portion and that are bent along the circuit blocks adjacent to each other in the first direction and displaced with respect to each other in the second direction; and a plurality of branch wiring lines selectively connected to the plurality of unit circuits constituting each of the plurality of circuit blocks and to the plurality of trunk wiring lines. Among the circuit blocks adjacent to each other in the first direction and displaced with respect to each other in the second direction, a circuit block located closer to an end of the substrate portion in the second direction is an end-side circuit block, and a circuit block located closer to a center of the substrate portion in the second direction is a center-side circuit block. The plurality of trunk wiring lines include at least a first trunk wiring line and a second trunk wiring line that is disposed so as to be sandwiched between the first trunk wiring line and the variable-external-shape portion. Among the plurality of branch wiring lines, a plurality of branch wiring lines connected to the plurality of unit circuits constituting the center-side circuit block include at least a first branch wiring line connected to the first trunk wiring line and a second branch wiring line connected to the second trunk wiring line and disposed farther than the first branch wiring line from the end-side circuit block in the first direction.

(2) In addition to the above-described (1), the above-described circuit substrate may include: a common connection trunk wiring line that is disposed so as to be sandwiched between the circuit portion and the variable-external-shape portion in the substrate portion and that extends in parallel with the plurality of trunk wiring lines; and a plurality of common connection branch wiring lines connected to the common connection trunk wiring line and to all the unit circuits constituting the plurality of circuit blocks. The plurality of trunk wiring lines may include a trunk wiring line disposed so as to be sandwiched between the common connection trunk wiring line and the variable-external-shape portion.

(3) In addition to the above-described (2), in the above-described circuit substrate, the common connection trunk wiring line may be disposed closer than all the trunk wiring lines to the circuit portion in the second direction.

(4) In addition to the above-described (2) or (3), in the above-described circuit substrate, among the plurality of common connection branch wiring lines, a plurality of common connection branch wiring lines connected to the plurality of unit circuits constituting the center-side circuit block may be disposed closer, to the end-side circuit block in the first direction, than a branch wiring line connected to the trunk wiring line disposed so as to be sandwiched between the common connection trunk wiring line and the variable-external-shape portion among the plurality of branch wiring lines connected to the plurality of unit circuits constituting the center-side circuit block.

(5) In addition to the above-described (4), in the above-described circuit substrate, the common connection trunk wiring line may transmit a power supply voltage signal, and each of the plurality of common connection branch wiring lines may have a common positional relationship in the first direction with a corresponding branch wiring line of the plurality of branch wiring lines, the common connection branch wiring line and the corresponding branch wiring line being connected to an identical one of the plurality of unit circuits.

(6) In addition to any one of the above-described (1), (2), (3) and (5), in the above-described circuit substrate, the circuit portion may have a configuration in which the plurality of unit circuits constituting each of the plurality of circuit blocks are linearly arranged in the first direction.

(7) In addition to any one of the above-described (1), (2), (3) and (5), in the above-described circuit substrate, the plurality of trunk wiring lines may be disposed in such a manner that the first trunk wiring line is located closest to the circuit portion in the second direction, and the circuit portion may have a configuration in which a unit circuit connected to the first branch wiring line among the plurality of unit circuits constituting the center-side circuit block is located closest to the end-side circuit block in the first direction.

(8) In addition to any one of the above-described (1), (2), (3) and (5), in the above-described circuit substrate, the second branch wiring line may be connected to a unit circuit located farther than a unit circuit connected to the first branch wiring line from the end-side circuit block in the first direction among the plurality of unit circuits constituting the center-side circuit block.

(9) In addition to any one of the above-described (1), (2), (3) and (5), in the above-described circuit substrate, the first branch wiring line and the second branch wiring line may be connected to an identical unit circuit included in the plurality of unit circuits constituting the center-side circuit block.

(10) In addition to any one of the above-described (1), (2), (3) and (5), the above-described circuit substrate may include: a pixel region located closer than the circuit portion to the center in the second direction in the substrate portion, a plurality of pixels each serving as a display unit being disposed in the pixel region; and a plurality of pixel connection wiring lines disposed over the pixel region and the circuit portion and connected to the plurality of pixels and the plurality of unit circuits.

(11) In addition to the above-described (10), in the above-described circuit substrate, the plurality of pixels may be disposed in such a manner that a plurality of pixels are arranged in the first direction and a plurality of pixels are arranged in the second direction, and the circuit portion may have a configuration in which each unit circuit has a dimension in the first direction that is equal to a dimension in the first direction of each pixel.

(12) A display device related to an aspect of a technique described in the description of the present application includes: the circuit substrate according to any one of the above-described (1) to (11); and a counter substrate opposed to the circuit substrate.

According to an aspect of the techniques described in the description of the present application, it is possible to decrease a frame width.

DETAILED DESCRIPTION

First Embodiment

A first embodiment will be described with reference to FIG. 1 to FIG. 6. In this embodiment, a liquid crystal panel (display device) 10 will be described as an example. Some of these figures illustrate an X axis, a Y axis, and a Z axis, and the figures are drawn in such a manner that the individual axial directions correspond to the directions indicated in the individual figures.

Figure 1:
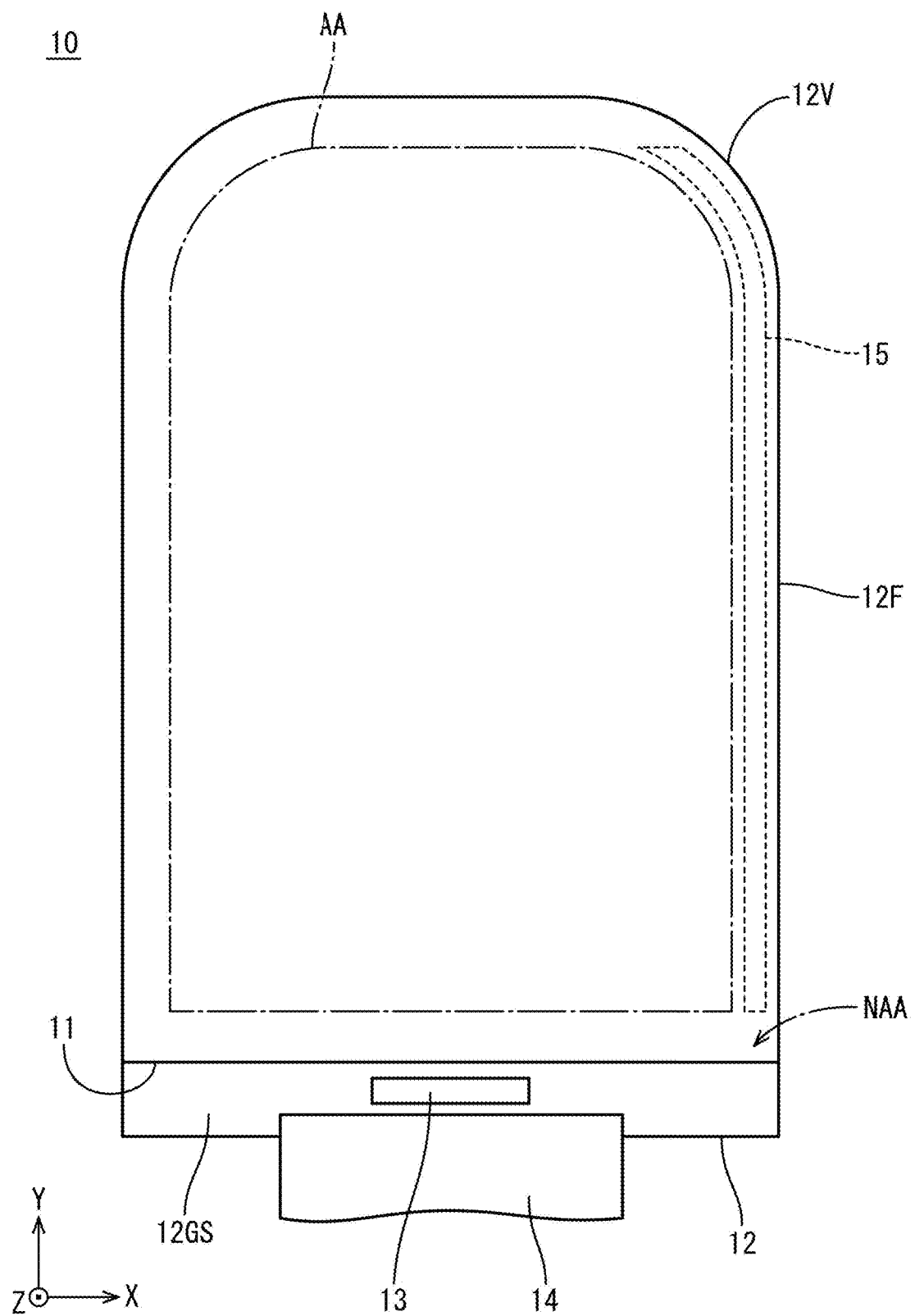
FIG. 1 is a plan view of a liquid crystal panel according to a first embodiment.

As illustrated in FIG. 1, the liquid crystal panel 10 according to this embodiment has a planar shape which is vertically-elongated substantially rectangular shape as a whole, and two of the four corner portions thereof are rounded. FIG. 1 is a plan view of the liquid crystal panel 10. In the liquid crystal panel 10, the short-side direction thereof corresponds to an X-axis direction, the long-side direction thereof corresponds to a Y-axis direction, and the thickness direction thereof corresponds to a Z-axis direction. The liquid crystal panel 10 is capable of displaying an image by using illumination light emitted by a backlight device (illumination device). In the liquid crystal panel 10, a center portion of the screen is a display region (pixel region) AA on which an image is to be displayed, whereas a frame-shaped outer peripheral portion surrounding the display region AA in the screen is a non-display region (frame region) NAA on which an image is not to be displayed. In FIG. 1, the range surrounded by a dotted-chain line is the display region AA.

As illustrated in FIG. 1, the liquid crystal panel 10 has a configuration in which a liquid crystal layer including liquid crystal molecules, which are substances whose optical characteristics are changed in response to an electric field applied thereto, is sandwiched between a pair of substantially transparent glass substrates 11 and 12 having an excellent translucency. In the pair of substrates 11 and 12, the substrate disposed on a front side is a CF substrate (a counter substrate) 11, and the substrate disposed on a rear side is an array substrate (circuit substrate, active matrix substrate, element substrate) 12. The CF substrate 11 and the array substrate 12 each have a multilayer structure of various films disposed on an inner surface side of a glass substrate (substrate portion) 11GS or 12GS. Of these substrates, the array substrate 12 has a long-side dimension greater than the long-side dimension of the CF substrate 11, one end portion thereof in the long-side direction does not overlap the CF substrate 11, and a driver 13 and a flexible substrate 14 are mounted in the portion. In this embodiment, the array substrate 12 has a pair of rounded corner portions at an end portion opposite to the portion provided with the driver 13 and the flexible substrate 14 in the long-side direction.

The driver 13 is formed of an LSI chip having a driving circuit therein, is chip on glass (COG)-mounted on the glass substrate 12GS of the array substrate 12, and processes various signals transmitted by the flexible substrate 14. The flexible substrate 14 has a configuration in which many wiring patterns (not illustrated) are formed on a substrate made of an insulating and flexible synthetic resin material (for example, polyimide resin or the like). One end thereof is connected to the array substrate 12, and the other end is connected to an external control substrate (signal supply source). Various signals supplied from the control substrate are transmitted to the liquid crystal panel 10 via the flexible substrate 14. In the non-display region NAA in the glass substrate 12GS of the array substrate 12, a gate circuit portion (circuit portion) 15 is provided at a position adjacent to one side of the display region AA in the X-axis direction. The gate circuit portion 15 is disposed in one long-side portion of the non-display region NAA having a vertically elongated frame shape and extends mostly in the long-side direction of the array substrate 12. The gate circuit portion 15 is for supplying scanning signals to gate wiring lines 16, which will be described below, and is monolithically provided on the glass substrate 12GS of the array substrate 12. The specific circuit configuration or the like of the gate circuit portion 15 will be described in detail below.

Figure 2:
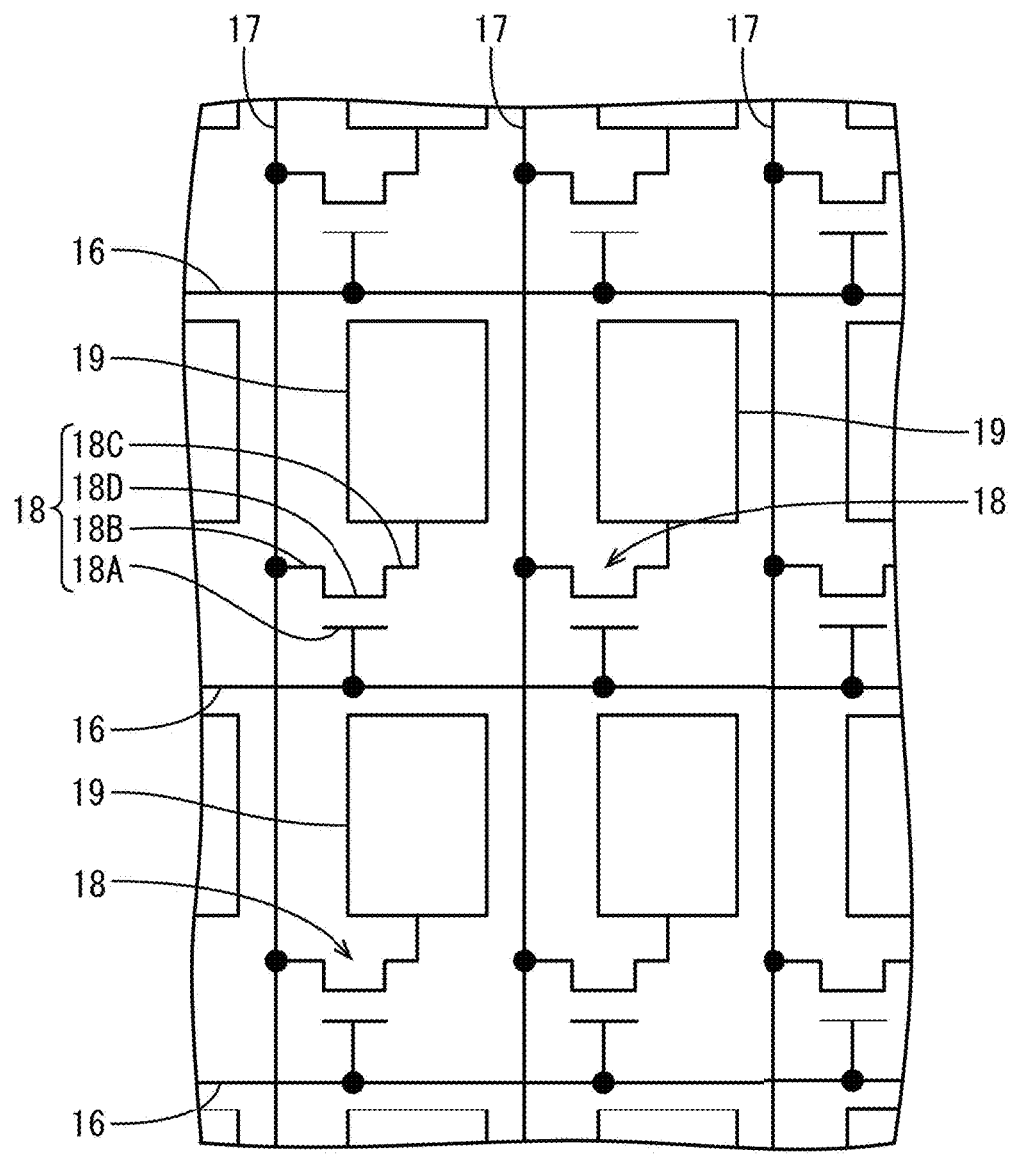
FIG. 2 is a circuit diagram illustrating the alignment of pixels in a display region of the liquid crystal panel.

As illustrated in FIG. 2, many gate wiring lines (pixel wiring lines, scanning wiring lines) 16 and many source wiring lines (signal wiring lines, data wiring lines) 17 are disposed in a lattice pattern on an inner-surface side of the glass substrate 12GS of the array substrate 12 in the display region AA, and pixel transistors 18 serving as switching elements and pixel electrodes 19 are provided near the intersections thereof. FIG. 2 is a circuit diagram illustrating the alignment of pixels PX in the display region AA of the array substrate 12. The gate wiring lines 16 extend in the X-axis direction (second direction) so as to horizontally traverse the display region AA and are connected to gate electrodes 18A of the individual pixel transistors 18, whereas the source wiring lines 17 extend in the Y-axis direction (first direction) so as to vertically traverse the display region AA and are connected to source electrodes 18B of the individual pixel transistors 18. The plurality of gate wiring lines 16 are arranged at intervals in the Y-axis direction, whereas the plurality of source wiring lines 17 are arranged at intervals in the X-axis direction. The plurality of pixel transistors 18 and the plurality of pixel electrodes 19 are disposed in a matrix in a plane so as to be regularly arranged in the X-axis direction and the Y-axis direction. The pixel electrodes 19 are connected to drain electrodes 18C of the pixel transistors 18. The pixel transistors 18 each have a channel portion 18D that is connected to the source electrode 18B and the drain electrode 18C and that is made of a semiconductor material. The pixel transistors 18 are driven on the basis of scanning signals supplied to the gate wiring lines 16, and potentials based on image signals (data signals) supplied to the source wiring lines 17 accordingly cause the pixel electrodes 19 to be charged. On the other hand, on an inner-surface side of the CF substrate 11 in the display region AA, color filters of three colors, red (R), green (G), and blue (B), disposed so as to be superimposed on the individual pixel electrodes 19, and a light shielding portion (black matrix) for partitioning the color filters adjacent to each other are provided. In the liquid crystal panel 10, R, G, and B color filters arranged in the X-axis direction and three pixel electrodes 19 opposed to the respective color filters constitute a three-color pixel PX. The pixel PX is a display unit in the display region AA. A plurality of pixels PX are aligned at a predetermined alignment pitch in the X-axis direction and the Y-axis direction. In addition, either the CF substrate 11 or the array substrate 12 is provided with a common electrode that is made of a transparent electrode material similar to that of the pixel electrodes 19 and that is disposed so as to be superimposed on the pixel electrodes 19 with a space therebetween. In the liquid crystal panel 10, a predetermined electric field is applied to the liquid crystal layer on the basis of a potential difference arising between the common electrode and the individual pixel electrodes 19, and accordingly it is possible to cause the individual pixels to perform predetermined gradation display.

Now, the external shape of the glass substrate 12GS constituting the array substrate 12 will be described with reference to FIG. 1. The external shape of the glass substrate 12GS of the array substrate 12 includes, as illustrated in FIG. 1, a fixed-external-shape portion 12F whose external dimension in the X-axis direction is fixed regardless of a position in the Y-axis direction, and a variable-external-shape portion 12V whose external dimension in the X-axis direction varies according to a position in the Y-axis direction. The fixed-external-shape portion 12F constitutes a most part of a pair of long-side portions of the glass substrate 12GS of the array substrate 12 and linearly extends in the Y-axis direction. The variable-external-shape portion 12V constitutes a pair of corner portions located at an end portion opposite to the portion provided with the driver 13 and the flexible substrate 14 in the long-side direction of the glass substrate 12GS of the array substrate 12, and is curved so as to form a substantially arc shape in plan view. The display region AA of the liquid crystal panel 10 has a vertically-elongated substantially rectangular shape with a pair of corner portions that are rounded in accordance with the above-described external shape of the array substrate 12.

Figure 3:
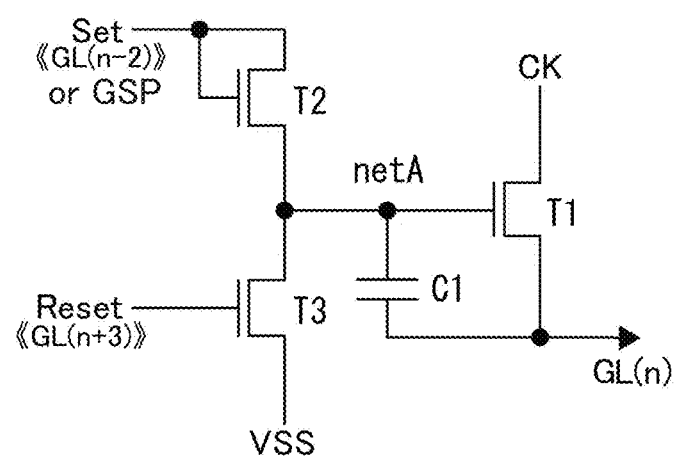
FIG. 3 is a circuit diagram illustrating the circuit configuration of a unit circuit constituting a gate circuit portion.

Next, the gate circuit portion 15 will be described in detail with reference to FIG. 3 to FIG. 5. The specific circuit configuration of a unit circuit 20 is as illustrated in FIG. 3. FIG. 3 is a circuit diagram illustrating the circuit configuration of the unit circuit 20 constituting the gate circuit portion 15. The unit circuit 20 includes three gate circuit transistors T1 to T3 and one capacitor C1. Hereinafter, a connection wiring line that connects the gate circuit transistors T1 to T3 and the capacitor C1 to each other will be referred to as an internal node netA. The first gate circuit transistor T1 has a gate electrode connected to the internal node netA, a source electrode connected to an input terminal of a clock signal CK (any one of clock signals CK1, CK2, CK1B, and CK2B), and a drain electrode connected to an output terminal of a scanning signal GL(n) in the n-th stage. Here, "n" is an integer (natural number) that is 1 or greater. The above-described input terminal of the clock signal CK is selectively connected to any one of clock signal wiring lines 22 to 25, which will be described below. The second gate circuit transistor T2 has a gate electrode and a source electrode connected to an input terminal of a set signal Set or a gate start pulse signal GSP, and a drain electrode connected to the internal node netA. The input terminal of the gate start pulse signal GSP is connected to a gate start pulse signal wiring line 21, which will be described below. The input terminal of the set signal Set is connected to an output terminal of a scanning signal GL(n−2) in the (n−2)-th stage, "n" being an integer that is 3 or greater. The third gate circuit transistor T3 has a gate electrode connected to an input terminal of a reset signal Reset, a source electrode connected to the internal node netA, and a drain electrode connected to an input terminal of a power supply voltage signal VSS. The input terminal of the reset signal Reset is connected to an output terminal of a scanning signal GL(n+ 3) in the (n+3)-th stage, "n" being an integer that is 1 or greater. The input terminal of the power supply voltage signal VSS is connected to a power supply voltage signal wiring line 26, which will be described below. The capacitor C1 has one electrode connected to the internal node netA and the other electrode connected to the output terminal of the scanning signal GL(n) in the n-th stage.

Figure 4:
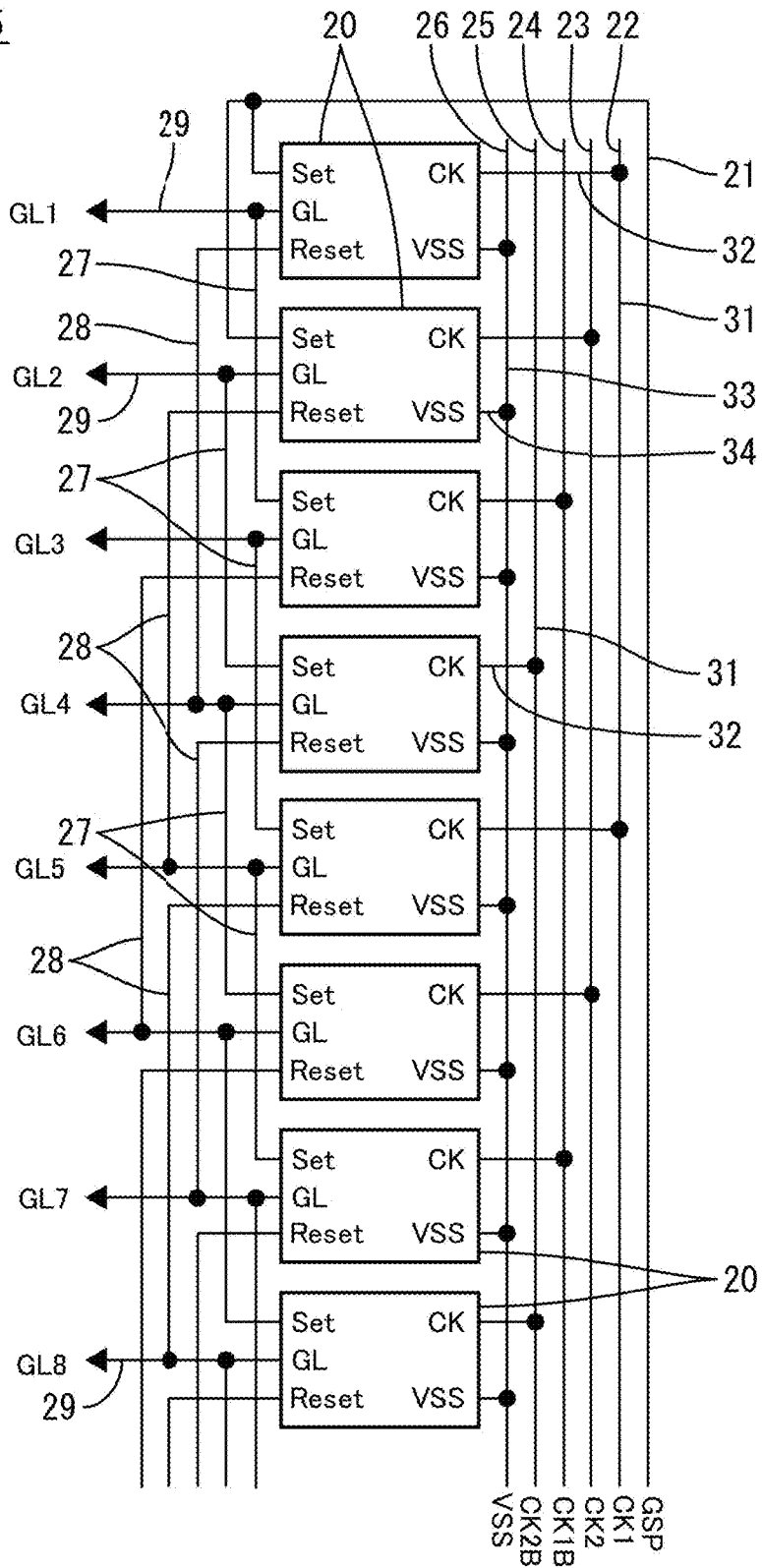
FIG. 4 is a block diagram illustrating the gate circuit portion.
Figure 5:
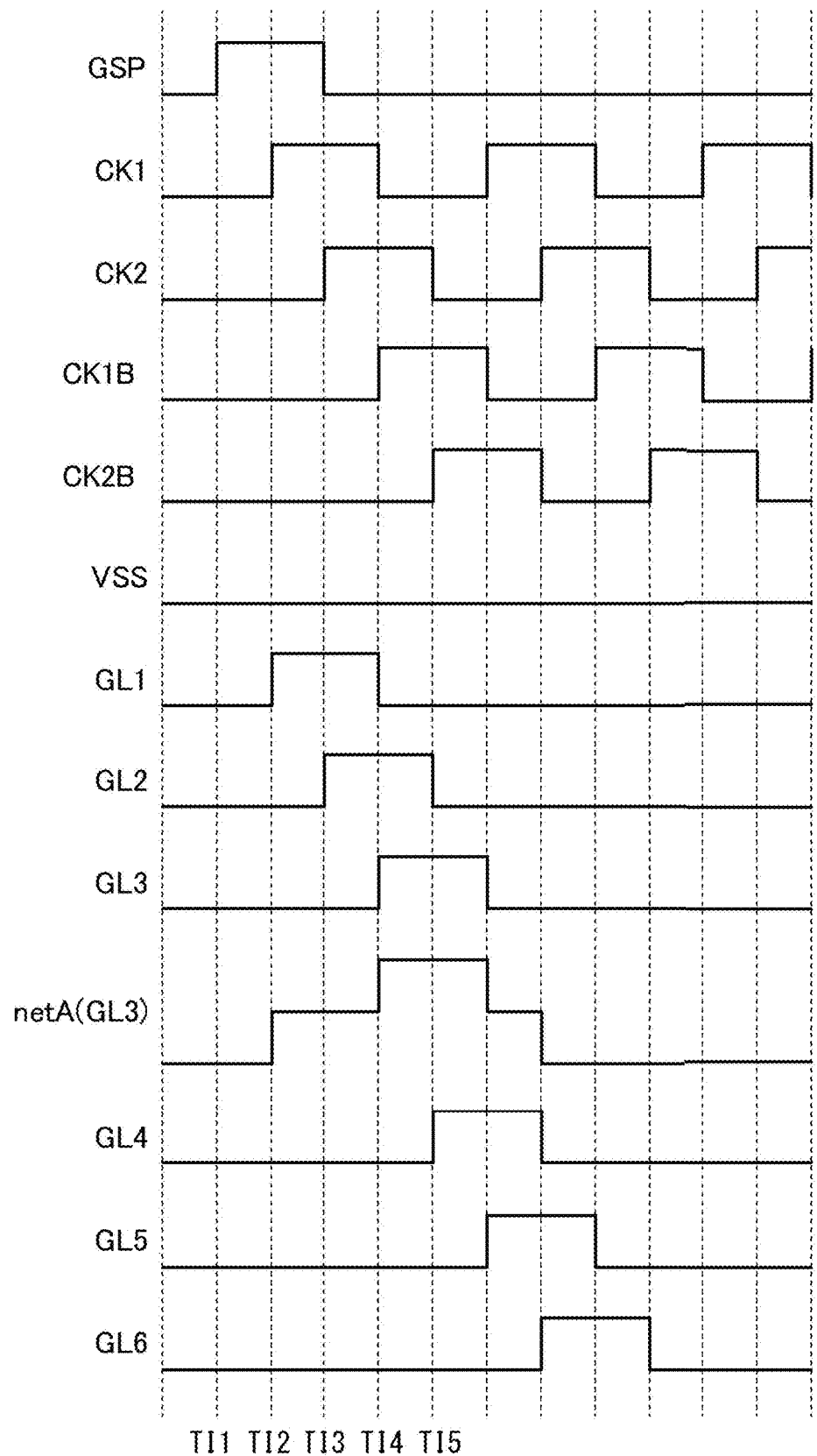
FIG. 5 is a timing chart related to the operation of unit circuits.

FIG. 4 is a block diagram illustrating the gate circuit portion 15 that supplies scanning signals GL(n) to the gate wiring lines 16. The gate circuit portion 15 is a so-called shift-register circuit, and includes a plurality of unit circuits 20 as illustrated in FIG. 4. The gate circuit portion 15 is connected to the gate start pulse signal wiring line 21, the plurality of (four in this embodiment) clock signal wiring lines 22 to 25, the power supply voltage signal wiring line (common connection wiring line) 26, set signal wiring lines 27, and reset signal wiring lines 28. The gate start pulse signal wiring line 21 supplies the gate start pulse signal GSP to the unit circuits 20 in the first stage and the second stage constituting the gate circuit portion 15, and is connected to the input terminals of the gate start pulse signal GSP in the unit circuits 20 in the first stage and the second stage. The four clock signal wiring lines 22 to 25 are selectively connected to the plurality of unit circuits 20 constituting the gate circuit portion 15, and respectively transmit four clock signals CK1, CK2, CK1B, and CK2B with different timings. Specifically, the first clock signal wiring line 22 included in the clock signal wiring lines 22 to 25 is connected to the input terminals of the clock signal CK1 in the unit circuits 20 in the (4n−3)-th stages, "n" being an integer that is 1 or greater, and supplies the clock signal CK1 to the input terminals. The second clock signal wiring line 23 included in the clock signal wiring lines 22 to 25 is connected to the input terminals of the clock signal CK2 in the unit circuits 20 in the (4n−2)-th stages, "n" being an integer that is 1 or greater, and supplies the clock signal CK2 to the input terminals. The third clock signal wiring line 24 included in the clock signal wiring lines 22 to 25 is connected to the input terminals of the clock signal CK1B in the unit circuits 20 in the (4n−1)-th stages, "n" being an integer that is 1 or greater, and supplies the clock signal CK1B to the input terminals. The fourth clock signal wiring line 25 included in the clock signal wiring lines 22 to 25 is connected to the input terminals of the clock signal CK2B in the unit circuits 20 in the (4n)-th stages, "n" being an integer that is 1 or greater, and supplies the clock signal CK2B to the input terminals. The power supply voltage signal wiring line 26 is connected to the individual input terminals of the power supply voltage signal VSS in all the unit circuits 20 constituting the gate circuit portion 15, and supplies the power supply voltage signal VSS that is kept at a constant low-level potential to the individual input terminals over time. The set signal wiring lines 27 are connected to the output terminals of the scanning signals GL in the unit circuits 20 and the input terminals of the set signal Set in the unit circuits 20 in subsequent stages, and transmit the set signal Set. The reset signal wiring lines 28 are connected to the output terminals of the scanning signals GL in the unit circuits 20 and the input terminals of the reset signal Reset in the unit circuits 20 in preceding stages, and transmit the reset signal Reset.

As illustrated in FIG. 4, the plurality of unit circuits 20 constituting the gate circuit portion 15 each output the set signal Set to the unit circuit 20 in a subsequent stage and output the reset signal Reset to the unit circuit 20 in a preceding stage when outputting the scanning signal GL(n) to the gate wiring line 16 connected thereto. Specifically, first, the unit circuits 20 in the first stage and the second stage sequentially supply scanning signals GL1 and GL2 to the gate wiring lines 16 in the first stage and the second stage connected thereto, in response to input of the gate start pulse signal GSP from the outside and sequential input of the clock signals CK1 and CK2. At this time, the unit circuits 20 in the first stage and the second stage sequentially output the set signals Set to the unit circuits 20 in the third stage and the fourth stage. In response to sequential input of the set signals Set from the unit circuits 20 in the first stage and the second stage and sequential input of the clock signals CK1B and CK2B, the unit circuits 20 in the third stage and the fourth stage sequentially supply scanning signals GL3 and GL4 to the gate wiring lines 16 in the third stage and the fourth stage. At this time, the unit circuit 20 in the third stage outputs the set signal Set to the unit circuit 20 in the fifth stage, whereas the unit circuit 20 in the fourth stage outputs the set signal Set to the unit circuit 20 in the sixth stage and outputs the reset signal Reset to the unit circuit 20 in the first stage. In response to sequential input of the set signals Set from the unit circuits 20 in the third stage and the fourth stage and sequential input of the clock signals CK1 and CK2, the unit circuits 20 in the fifth stage and the sixth stage sequentially supply scanning signals GL5 and GL6 to the gate wiring lines 16 in the fifth stage and the sixth stage. At this time, the unit circuit 20 in the fifth stage outputs the set signal Set to the unit circuit 20 in the seventh stage and outputs the reset signal Reset to the unit circuit 20 in the second stage. On the other hand, the unit circuit 20 in the sixth stage outputs the set signal Set to the unit circuit 20 in the eighth stage and outputs the reset signal Reset to the unit circuit 20 in the third stage. In generalization about the unit circuits 20 in the fourth and subsequent stages, when "n" is an integer that is 4 or greater, the unit circuit 20 in the n-th stage supplies the scanning signal GL(n) to the gate wiring line 16 in the n-th stage on the basis of the set signal Set input from the unit circuit 20 in the (n−2)-th stage, and then outputs the set signal Set to the unit circuit 20 in the (n+2)-th stage and outputs the reset signal Reset to the unit circuit 20 in the (n−3)-th stage. Accordingly, the plurality of unit circuits 20 constituting the gate circuit portion 15 are capable of sequentially supplying scanning signals GL(n) to the gate wiring lines 16 connected thereto from the upper-stage side.

Next, the operation of the unit circuits 20 will be described with reference to FIG. 5. FIG. 5 is a timing chart illustrating the operation of the unit circuits 20. Before describing the operation of the unit circuits 20, the individual signals and potentials illustrated in FIG. 5 will be described. FIG. 5 illustrates, in order from the top, the potentials of the gate start pulse signal GSP, the clock signals CK1, CK2, CK1B, and CK2B, the power supply voltage signal VSS, the scanning signals GL1 to GL6 in the first stage to the sixth stage, and the internal node netA related to the scanning signal GL3 in the third stage. In this embodiment, the power supply voltage signal VSS is constantly kept at a constant low-level potential, as illustrated in FIG. 5. The gate start pulse signal GSP and the clock signals CK1, CK2, CK1B, and CK2B each have a rectangular wave, in which a low-level potential and a high-level potential are alternately repeated in a constant period. The clock signal CK1 and the clock signal CK1B constantly have an inverse relationship of a low-level potential and a high-level potential. Likewise, the clock signal CK2 and the clock signal CK2B constantly have an inverse relationship of a low-level potential and a high-level potential. The high-level potentials of the clock signals CK1, CK2, CK1B, and CK2B have sufficient values to bring the individual gate circuit transistors T1 to T3 and the pixel transistors 18 into an ON-state.

The operation of the unit circuits 20 in the fir stage to the fourth stage will be representatively described in detail. As illustrated in FIG. 5, at time TI1, in each of the unit circuits 20 in the first stage and the second stage, the gate start pulse signal GSP is supplied to the gate electrode and the source electrode of the second gate circuit transistor T2. Accordingly, in each of the unit circuits 20 in the first stage and the second stage, the second gate circuit transistor T2 enters an ON-state, and a high-level potential of the gate start pulse signal GSP input to the source electrode thereof is supplied to the drain electrode. Accordingly, in each of the unit circuits 20 in the first stage and the second stage, the capacitor C1 is charged, the internal node netA is kept at a high-level potential, and the first gate circuit transistor T1 enters an ON-state. Subsequently, at time 112, the clock signal CK1 has a high-level potential. Accordingly, in the unit circuit 20 in the first stage, the high-level potential of the clock signal CK1 is supplied from the source electrode to the drain electrode of the first gate circuit transistor T1 that is in an ON-state, and thus the potential of the output terminal of the scanning signal GL increases. At this time, in the unit circuit 20 in the first stage, the potential of the internal node netA increases in accordance with the increase in the potential of the output terminal of the scanning signal GL because the capacitor C1 is provided between the internal node netA and the output terminal of the scanning signal GL. That is, the potential of the internal node netA is raised (bootstrapped). Accordingly, in the unit circuit 20 in the first stage, the gate electrode of the first gate circuit transistor T1 is at a higher potential, and thus the potential of the output terminal of the scanning signal GL reaches the high-level potential of the clock signal CK1. Accordingly, the scanning signal GL1 at a high level is supplied to the gate wiring line 16 in the first stage. At this time, the scanning signal GL1 output to the output terminal of the scanning signal GL in the unit circuit 20 in the first stage is supplied as a set signal Set to the input terminal of the set signal Set in the unit circuit 20 in the third stage. Accordingly, in the unit circuit 20 in the third stage, the set signal Set is supplied to the gate electrode and the source electrode of the second gate circuit transistor T2. Thus, the capacitor C1 is charged, the internal node netA is kept at a high-level potential, and the first gate circuit transistor T1 enters an ON-state.

Subsequently, at time TI3, the clock signal CK2 has a high-level potential. Accordingly, in the unit circuit 20 in the second stage, the high-level potential of the clock signal CK2 is supplied from the source electrode to the drain electrode of the first gate circuit transistor T1 that is in an ON-state, and thus the potential of the output terminal of the scanning signal GL increases. At this time, in the unit circuit 20 in the second stage, the potential of the internal node netA is raised, and thus the potential of the output terminal of the scanning signal GL reaches the high-level potential of the clock signal CK2. Accordingly, the scanning signal GL2 at a high level is supplied to the gate wiring line 16 in the second stage. At this time, the scanning signal GL2 output to the output terminal of the scanning signal GL in the unit circuit 20 in the second stage is supplied as a set signal Set to the input terminal of the set signal Set in the unit circuit 20 in the fourth stage.

Subsequently, at time TI4, the clock signal CK1B has a high-level potential. Accordingly, in the unit circuit 20 in the third stage, the high-level potential of the clock signal CK1B is supplied from the source electrode to the drain electrode of the first gate circuit transistor T1 that is in an ON-state, and thus the potential of the output terminal of the scanning signal GL increases. At this time, in the unit circuit 20 in the third stage, the potential of the internal node netA is raised, and thus the potential of the output terminal of the scanning signal GL reaches the high-level potential of the clock signal CK1B. Accordingly, the scanning signal GL3 at a high level is supplied to the gate wiring line 16 in the third stage. At this time, the scanning signal GL3 output to the output terminal of the scanning signal GL in the unit circuit 20 in the third stage is supplied as a set signal Set to the input terminal of the set signal Set in the unit circuit 20 in the fifth stage. On the other hand, at time 114, the clock signal CK1 has a low-level potential. Accordingly, in the unit circuit 20 in the first stage, the potential of the internal node netA is raised and thus the output terminal of the scanning signal GL is at a low-level potential.

Subsequently, at time TI5, the clock signal CK2B has a high-level potential. Accordingly, in the unit circuit 20 in the fourth stage, the high-level potential of the clock signal CK2B is supplied from the source electrode to the drain electrode of the first gate circuit transistor T1 that is in an ON-state, and thus the potential of the output terminal of the scanning signal GL increases. At this time, in the unit circuit 20 in the fourth stage, the potential of the internal node netA is raised, and thus the potential of the output terminal of the scanning signal GL reaches the high-level potential of the clock signal CK2B. Accordingly, the scanning signal GL4 at a high level is supplied to the gate wiring line 16 in the fourth stage. At this time, the scanning signal GL4 output to the output terminal of the scanning signal GL in the unit circuit 20 in the fourth stage (n-th stage) is supplied as a set signal Set to the input terminal of the set signal Set in the unit circuit 20 in the sixth stage (n+2-th stage), and is supplied as a reset signal Reset to the input terminal of the reset signal Reset in the unit circuit 20 in the first stage (n−3-th stage). Accordingly, in the unit circuit 20 in the first stage, the power supply voltage signal VSS is supplied from the source electrode to the drain electrode of the third gate circuit transistor T3, and thus the internal node netA is at a low-level potential of the power supply voltage signal VSS. Accordingly, the first gate circuit transistor T1 in the unit circuit 20 in the first stage enters an OFF-state, and the output terminal of the scanning signal GL and the internal node netA are at a low-level potential. On the other hand, at time 115, the clock signal CK2 has a low-level potential. Accordingly, in the unit circuit 20 in the second stage, the potential of the internal node netA is raised and thus the output terminal of the scanning signal GL is at a low-level potential.

Figure 6:
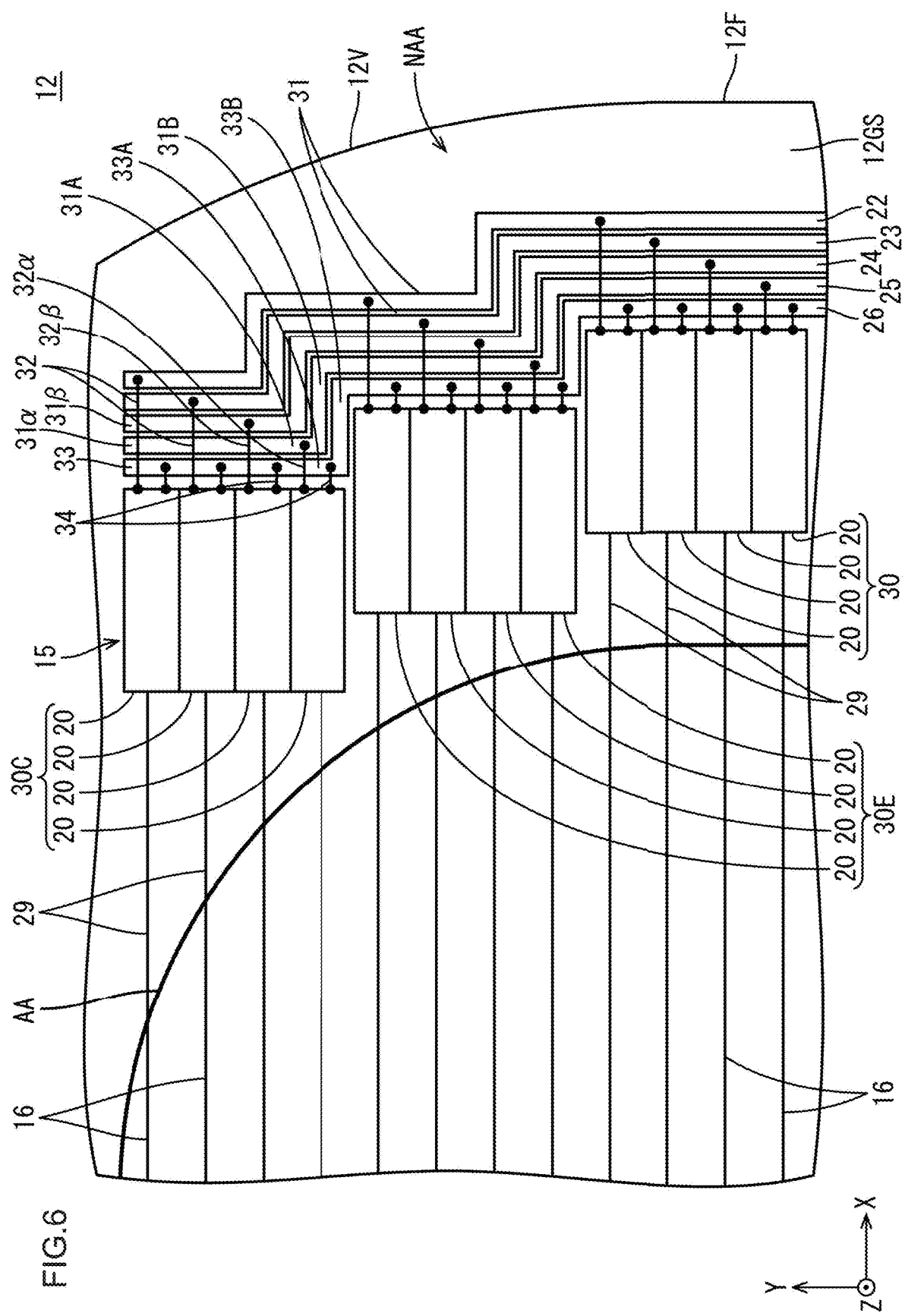
FIG. 6 is a plan view illustrating unit circuits in an array substrate and various wiring lines connected to the unit circuits.

Next, the configuration of the vicinity of the variable-external-shape portion 12V will be described in detail with reference to FIG. 6. FIG. 6 is a plan view schematically illustrating the configuration of the vicinity of the variable-external-shape portion 12V in the array substrate 12. The unit circuits 20 having the above-described circuit configuration are individually connected to the gate wiring lines 16 disposed in the display region AA via gate connection wiring lines (pixel connection wiring lines) 29 as illustrated in FIG. 6. The gate connection wiring lines 29, the number of which is the same as the number of unit circuits 20, are disposed in the non-display region NAA together with the unit circuits 20. One end portions thereof are connected to the gate wiring lines 16, and the other end portions thereof are connected to the output terminals of the scanning signals GL in the unit circuits 20. The unit circuits 20 and the various wiring lines 21 to 29 are formed by appropriately using the metallic material, semiconductor material, and transparent electrode material that constitute the structures (the gate wiring lines 16, the source wiring lines 17, the pixel transistors 18, the pixel electrodes 19, and so forth) disposed in the display region AA of the array substrate 12.

Next, the alignment of the unit circuits 20 near the variable-external-shape portion 12V will be described. As illustrated in FIG. 6, the unit circuits 20 each have a horizontally-elongated substantially rectangular formation range in plan view, and a plurality of unit circuits 20 adjacent to each other in the Y-axis direction (first direction) constitute one circuit block 30. In this embodiment, the number of unit circuits 20 constituting one circuit block 30 is the same as the number of clock signals CK1, CK2, CK1B, and CK2B (clock signal wiring lines 22 to 25), that is, four. The four unit circuits 20 constituting the circuit block 30 are linearly arranged in the Y-axis direction, and both end positions thereof in the X-axis direction (second direction) are aligned. Accordingly, the circuit block 30 has a substantially rectangular formation range in plan view. A plurality of circuit blocks 30 are arranged adjacent to each other in the Y-axis direction in the non-display region NAA of the array substrate 12. Among the plurality of circuit blocks 30, a plurality of circuit blocks 30 disposed near the fixed-external-shape portion 12F in the glass substrate 12GS of the array substrate 12 are linearly arranged in the Y-axis direction, and both end positions thereof in the X-axis direction are aligned. On the other hand, among the plurality of circuit blocks 30, a plurality of circuit blocks 30 disposed near the variable-external-shape portion 12V in the glass substrate 12GS of the array substrate 12 are disposed in such a manner that those adjacent to each other in the Y-axis direction are displaced with respect to each other in the X-axis direction in accordance with variation in the external dimension of the variable-external-shape portion 12V.

Specifically, as illustrated in FIG. 6, the variable-external-shape portion 12V has an external dimension that decreases from a center toward an end in the Y-axis direction or increases from the end toward the center. Thus, the plurality of circuit blocks 30 disposed near the variable-external-shape portion 12V are displaced with respect to each other in such a manner that the circuit block 30 closer to the center in the Y-axis direction (the lower side in FIG. 6) is disposed closer to the end in the X-axis direction, and the circuit block 30 closer to the end in the Y-axis direction (the upper side in FIG. 6) is disposed closer to the center in the X-axis direction. Accordingly, a certain space (distance) or more in the X-axis direction is ensured between the circuit blocks 30 and the display region AA and between the circuit blocks 30 and the variable-external-shape portion 12V. The amount of displacement in the X-axis direction between the circuit blocks 30 adjacent to each other in the Y-axis direction is smaller than the dimension in the X-axis direction of the unit circuit 20. Among the circuit blocks 30 adjacent to each other in the Y-axis direction and displaced with respect to each other in the X-axis direction near the variable-external-shape portion 12V, the circuit block 30 located closer to the end of the glass substrate 12GS in the X-axis direction is referred to as an end-side circuit block 30E, whereas the circuit block 30 located closer to the center of the glass substrate 12GS in the X-axis direction is referred to as a center-side circuit block 30C. Hereinafter, in the case of distinguishing the circuit blocks 30 from each other, a character "C" will be attached to the reference numeral of the "center-side circuit block" and a character "E" will be attached to the reference numeral of the "end-side circuit block". In the case of collectively referring to the circuit blocks 30 without distinguishing them from each other, no character will be attached to the reference numeral. The center-side circuit block 30C is located closer than the end-side circuit block 30E to the end in the Y-axis direction. The end-side circuit block 30E is located closer than the center-side circuit block 30C to the center in the Y-axis direction. The end-side circuit block 30E and the center-side circuit block 30C aligned in this manner have an external shape that is substantially step-shaped in microscopic plan view and that is substantially arc-shaped along the variable-external-shape portion 12V in macroscopic plan view, on the variable-external-shape portion 12V side (on the trunk wiring line 31 side, which will be described below). In FIG. 6, for convenience of description, the circuit block 30 at the top in the figure is regarded as a "center-side circuit block" and is denoted by a reference symbol "30C", and the second circuit block 30 from the top in the figure is regarded as an "end-side circuit block" and is denoted by a reference symbol "30E". For example, in a case where the circuit block 30 at the bottom in the figure is regarded as an "end-side circuit block", the second circuit block 30 from the top in the figure is a "center-side circuit block".

Next, a description will be given of the routing of the clock signal wiring lines 22 to 25 and the power supply voltage signal wiring line 26 near the variable-external-shape portion 12V. In FIG. 6, the gate start pulse signal wiring line 21, the set signal wiring lines 27, and the reset signal wiring lines 28 are not illustrated because the space is limited. As illustrated in FIG. 6, the clock signal wiring lines 22 to 25 each include a trunk wiring line 31 disposed so as to be sandwiched between the gate circuit portion 15 and the variable-external-shape portion 12V or the fixed-external-shape portion 12F in the glass substrate 12GS, and branch wiring lines 32 selectively connected to the trunk wiring line 31 and any of the plurality of unit circuits 20 constituting the circuit blocks 30. The trunk wiring line 31 substantially linearly extends in the Y-axis direction near the fixed-external-shape portion 12F, and is bent in accordance with variation in the external dimension of the variable-external-shape portion 12V near the variable-external-shape portion 12V. Specifically, near the variable-external-shape portion 12V, the trunk wiring line 31 extends to form a substantially step shape in plan view so as to be parallel with the external shapes of the end-side circuit block 30E and the center-side circuit block 30C on the variable-external-shape portion 12V side, and includes first extending portions 31A extending in the Y-axis direction and second extending portions 31B extending in the X-axis direction that are alternately connected to each other. As described above, the trunk wiring line 31 is bent at substantially right angles along the end-side circuit block 30E and the center-side circuit block 30C adjacent to each other in the Y-axis direction, and each bent portion is substantially L-shaped in plan view. Regarding the branch wiring lines 32, branch wiring lines 32 the number of which is the same as the number of circuit blocks 30 constituting the gate circuit portion 15 branch off from the trunk wiring line 31, and each branch wiring line 32 is selectively connected to any one of the plurality of unit circuits 20 constituting the circuit block 30.

On the other hand, the power supply voltage signal wiring line 26 includes, as illustrated in FIG. 6, a common connection trunk wiring line 33 disposed so as to be sandwiched between the gate circuit portion 15 and the variable-external-shape portion 12V in the glass substrate 12GS, and a plurality of common connection branch wiring lines 34 connected to the common connection trunk wiring line 33 and all the unit circuits 20 constituting the circuit blocks 30. The common connection trunk wiring line 33 substantially linearly extends in the Y-axis direction near the fixed-external-shape portion 12F, and is bent in accordance with variation in the external dimension of the variable-external-shape portion 12V near the variable-external-shape portion 12V. Specifically, near the variable-external-shape portion 12V, the common connection trunk wiring line 33 extends to form a substantially step shape in plan view so as to be parallel with the external shapes of the end-side circuit block 30E and the center-side circuit block 30C on the variable-external-shape portion 12V side, and includes first extending portions 33A extending in the Y-axis direction and second extending portions 33B extending in the X-axis direction that are alternately connected to each other. As described above, the common connection trunk wiring line 33 extends so as to be parallel with the plurality of trunk wiring lines 31. Regarding the common connection branch wiring lines 34, common connection branch wiring lines 34 the number of which is the same as the number calculated by multiplying the number of circuit blocks 30 constituting the gate circuit portion 15 by the number of unit circuits 20 constituting a circuit block 30 branch off from the common connection trunk wiring line 33, and are individually connected to the plurality of unit circuits 20 constituting the circuit blocks 30.

The four trunk wiring lines 31 constituting the clock signal wiring lines 22 to 25 extend in parallel with each other as illustrated in FIG. 6. The four trunk wiring lines 31 are made of a metallic material disposed in the same layer and thus are arranged with a predetermined space therebetween to avoid mutual short-circuit. The plurality of trunk wiring lines 31 include at least a first trunk wiring line 31α disposed relatively close to the display region AA (close to the center of the glass substrate 12GS in the X-axis direction) and a second trunk wiring line 31β disposed relatively close to the variable-external-shape portion 12V (close to the end of the glass substrate 12GS in the X-axis direction). The first trunk wiring line 31α is disposed so as to be sandwiched between the display region AA and the second trunk wiring line 31β. The second trunk wiring line 31β is disposed so as to be sandwiched between the first trunk wiring line 31α and the variable-external-shape portion 12V. In FIG. 6, for convenience of description, the trunk wiring line 31 closest to the display region AA is regarded as a "first trunk wiring line" and is denoted by a reference symbol "31α", and the trunk wiring line 31 second closest to the display region AA is regarded as a "second trunk wiring line" and is denoted by a reference symbol "31β". For example, in a case where the trunk wiring line 31 third closest to the display region AA is regarded as a "second trunk wiring line", the trunk wiring line 31 second closest to the display region AA is regarded as a "first trunk wiring line". In addition, for example, in a case where the trunk wiring line 31 closest to the variable-external-shape portion 12V is regarded as a "second trunk wiring line", the trunk wiring line 31 third closest to the display region AA is regarded as a "first trunk wiring line". When the first trunk wiring line 31α is compared with the second trunk wiring line 31β in terms of the bent position at which the first extending portion 31A is connected to the second extending portion 31B, the bent position of the first trunk wiring line 31α is closer than the bent position of the second trunk wiring line 31β to the center of the glass substrate 12GS in both the X-axis direction and the Y-axis direction. That is, a straight line connecting the bent position of the first trunk wiring line 31α and the bent position of the second trunk wiring line 31β is inclined with respect to both the X-axis direction and the Y-axis direction. On the straight line, the bent position of the first trunk wiring line 31α and the bent position of the second trunk wiring line 31β are displaced with respect to each other in such a manner that the bent position of the first trunk wiring line 31β is closer to the center of the glass substrate 12GS and the bent position of the second trunk wiring line 31β is closer to the variable-external-shape portion 12V of the glass substrate 12GS. Thus, in comparison of bent positions at which the first extending portions 31A adjacent in the X-axis direction to the plurality of unit circuits 20 constituting the end-side circuit block 30E and the second extending portions 31B adjacent in the Y-axis direction to the center-side circuit block 30C are connected to each other among the plurality of bent positions of the first trunk wiring line 31α and the second trunk wiring line 31β, the bent position of the first trunk wiring line 31α is closer than the bent position of the second trunk wiring line 31β to the end-side circuit block 30E in the Y-axis direction.

Here, if the branch wiring line 32 connected to the second trunk wiring line 31β is disposed closer than the branch wiring line 32 connected to the first trunk wiring line 31α to the end-side circuit block 30E in the Y-axis direction, the branch wiring line 32 connected to the second trunk wiring line 31β overlaps the bent position of the first trunk wiring line 31α in a positional relationship, which may increase the parasitic capacitance generated between the first trunk wiring line 31α and the branch wiring line 32 connected to the second trunk wiring line 31β. To avoid this, it is necessary to shift the bent position of the first trunk wiring line 31α toward the end-side circuit block 30E in the Y-axis direction and to increase the space between the center-side circuit block 30C and the end-side circuit block 30E by the amount of the shift. This may increase the frame width in the glass substrate 12GS.

Thus, in this embodiment, the plurality of branch wiring lines 32 connected to the plurality of unit circuits 20 constituting the center-side circuit block 30C include at least a first branch wiring line 32β 6 connected to the first trunk wiring line 31α and a second branch wiring line 32β connected to the second trunk wiring line 31β, and the second branch wiring line 32β among them is disposed farther than the first branch wiring line 32α from the end-side circuit block 30E in the Y-axis direction, as illustrated in FIG. 6. The first branch wiring line 32α 6 is disposed closer than the second branch wiring line 32β to the end-side circuit block 30E in the Y-axis direction and is sandwiched between the end-side circuit block 30E and the second branch wiring line 32β in the Y-axis direction. In FIG. 6, for convenience of description, the branch wiring line 32 connected to the trunk wiring line 31 closest to the display region AA is regarded as a "first branch wiring line" and is denoted by a reference symbol "32α", and the branch wiring line 32 connected to the trunk wiring line 31 second closest to the display region AA is regarded as a "second branch wiring line" and is denoted by a reference symbol "32β". In a case where the branch wiring line 32 connected to the trunk wiring line 31 third closest to the display region AA is regarded as a "second branch wiring line", for example, the branch wiring line 32 connected to the trunk wiring line 31 second closest to the display region AA is regarded as a "first branch wiring line". In a case where the branch wiring line 32 connected to the trunk wiring line 31 closest to the variable-external-shape portion 12V is regarded as a "second branch wiring line", for example, the branch wiring line 32 connected to the trunk wiring line 31 third closest to the display region AA is regarded as a "first branch wiring line".

With this configuration, the second branch wiring line 32β does not overlap the bent position of the first trunk wiring line 31α in a positional relationship and is displaced with respect to the bent position in the direction opposite to the end-side circuit block 30E in the Y-axis direction. Accordingly, it is not necessary to shift the bent position of the first trunk wiring line 31α toward the end-side circuit block 30E in the Y-axis direction and to increase the space between the center-side circuit block 30C and the end-side circuit block 30E by the amount of the shift. Thus, the frame width outside the display region AA of the glass substrate 12GS can be kept small and an excellent external appearance can be achieved. This is particularly preferable in a case where the number of trunk wiring lines 31 increases or the line width of the trunk wiring lines 31 increases in accordance with an increase in the resolution or size of the array substrate 12.

In addition, the plurality of trunk wiring lines 31 include those sandwiched between the common connection trunk wiring line 33 and the variable-external-shape portion 12V in the X-axis direction, as illustrated in FIG. 6. In this embodiment, all the trunk wiring lines 31 are sandwiched between the common connection trunk wiring line 33 and the variable-external-shape portion 12V in the X-axis direction. In other words, the common connection trunk wiring line 33 constituting the power supply voltage signal wiring line 26 is disposed closer than all the trunk wiring lines 31 to the gate circuit portion 15 (to the display region AA) in the X-axis direction, that is, closest to the end-side circuit block 30E and the center-side circuit block 30C. Here, if all the trunk wiring lines 31 are disposed closer than the common connection trunk wiring line 33 to the gate circuit portion 15, the individual bent positions of the individual trunk wiring lines 31 are closer than the bent position of the common connection trunk wiring line 33 to the end-side circuit block 30E in the Y-axis direction, and thus the common connection branch wiring lines 34 may overlap the bent positions of the individual trunk wiring lines 31 in a positional relationship. In this case, the parasitic capacitance generated between the trunk wiring lines 31 and the common connection branch wiring lines 34 may increase. To avoid this, it is necessary to shift the bent positions of the plurality of trunk wiring lines 31 toward the end-side circuit block 30E in the Y-axis direction and to increase the space between the center-side circuit block 30C and the end-side circuit block 30E by the amount of the shift. This may increase the frame width in the glass substrate 12GS. In contrast to this, in this embodiment, all the trunk wiring lines 31 are sandwiched between the common connection trunk wiring line 33 and the variable-external-shape portion 12V, and thus it is possible to avoid the positional relationship in which the common connection branch wiring lines 34 overlap the individual bent positions of all the trunk wiring lines 31. Accordingly, it is not necessary to shift the bent positions of the plurality of trunk wiring lines 31 toward the end-side circuit block 30E in the Y-axis direction and to increase the space between the center-side circuit block 30C and the end-side circuit block 30E by the amount of the shift. Thus, the frame width of the glass substrate 12GS can be kept smaller.

Furthermore, the plurality of common connection branch wiring lines 34 connected to the plurality of unit circuits 20 constituting the center-side circuit block 30C are disposed closer, to the end-side circuit block 30E in the Y-axis direction, than the branch wiring lines 32 connected to the trunk wiring lines 31 sandwiched between the common connection trunk wiring line 33 and the variable-external-shape portion 12V among the plurality of branch wiring lines 32 connected to the plurality of unit circuits 20 constituting the center-side circuit block 30C, as illustrated in FIG. 6. Accordingly, it is possible to avoid the positional relationship in which the branch wiring lines 32 connected to the trunk wiring lines 31 sandwiched between the common connection trunk wiring line 33 and the variable-external-shape portion 12V among the branch wiring lines 32 connected to the plurality of unit circuits 20 constituting the center-side circuit block 30C overlap the bent position of the common connection trunk wiring line 33. Accordingly, it is not necessary to shift the bent position of the common connection trunk wiring line 33 toward the end-side circuit block 30E in the Y-axis direction and to increase the space between the center-side circuit block 30C and the end-side circuit block 30E by the amount of the shift. Thus, the frame width of the glass substrate 12GS can be kept small.

In this embodiment, all the common connection branch wiring lines 34 connected to the plurality of unit circuits 20 constituting the center-side circuit block 30C are disposed closer than the branch wiring lines 32 connected to the individual unit circuits 20 constituting the center-side circuit block 30C to the end-side circuit block 30E in the Y-axis direction, as illustrated in FIG. 6. Thus, each of the common connection branch wiring lines 34 has a common positional relationship in the Y-axis direction with the corresponding branch wiring line 32, the common connection branch wiring line 34 and the corresponding branch wiring line 32 being connected to an identical one of the unit circuits 20. Here, the power supply voltage signal VSS tends to be supplied to many of circuit elements constituting the unit circuits 20 compared to the signals transmitted by the trunk wiring lines 31, and accordingly the routing of the common connection branch wiring lines 34 in the unit circuits 20 tends to be complicated. In contrast to this, in this embodiment, each of the plurality of common connection branch wiring lines 34 has a common positional relationship in the Y-axis direction with the corresponding branch wiring line 32, the common connection branch wiring line 34 and the corresponding branch wiring line 32 being connected to an identical one of the unit circuits 20, and thus a common routing design can be used. Accordingly, the circuit designing is facilitated.

Now, a description will be given of a specific arrangement order of the four trunk wiring lines 31 constituting the clock signal wiring lines 22 to 25 and the branch wiring lines 32 communicating therewith. The four trunk wiring lines 31 are aligned so as to be arranged in the order of, from the vicinity of the display region AA in the X-axis direction, the trunk wiring line 31 of the fourth clock signal wiring line 25, the trunk wiring line 31 of the third clock signal wiring line 24, the trunk wiring line 31 of the second clock signal wiring line 23, and the trunk wiring line 31 of the first clock signal wiring line 22, as illustrated in FIG. 6. The four branch wiring lines 32 communicating with the four trunk wiring lines 31 and connected to the individual unit circuits 20 constituting the center-side circuit block 30C are aligned so as to be arranged in the order of, from the vicinity of the end-side circuit block 30E in the Y-axis direction (the lower side in FIG. 6), the branch wiring line 32 of the fourth clock signal wiring line 25, the branch wiring line 32 of the third clock signal wiring line 24, the branch wiring line 32 of the second clock signal wiring line 23, and the branch wiring line 32 of the first clock signal wiring line 22. This alignment of the branch wiring lines 32 is common to all the circuit blocks 30. The four unit circuits 20 constituting the center-side circuit block 30C are aligned so as to be arranged in the order of, from the vicinity of the end-side circuit block 30E in the Y-axis direction, the unit circuit 20 in the (4n)-th stage connected to the branch wiring line 32 of the fourth clock signal wiring line 25, the unit circuit 20 in the (4n−1)-th stage connected to the branch wiring line 32 of the third clock signal wiring line 24, the unit circuit 20 in the (4n−2)-th stage connected to the branch wiring line 32 of the second clock signal wiring line 23, and the unit circuit 20 in the (4n−3)-th stage connected to the branch wiring line 32 of the first clock signal wiring line 22.

That is, the plurality of trunk wiring lines 31 are disposed in such a manner that the first trunk wiring line 31a is located closest to the gate circuit portion 15 in the X-axis direction, and the gate circuit portion 15 has a configuration in which the unit circuit 20 connected to the first branch wiring line 32β among the plurality of unit circuits 20 constituting the center-side circuit block 30C is located closest to the end-side circuit block 30E in the Y-axis direction, as illustrated in FIG. 6. Accordingly, the bent position of the first trunk wiring line 31α among the plurality of trunk wring lines 31 is closest to the end-side circuit block 30E in the Y-axis direction. The position at which the first branch wiring line 32α is connected to the first trunk wiring line 31α is located closest to the end-side circuit block 30E in the Y-axis direction. Thus, even if the connection position is the same as the bent position of the first trunk wiring line 31α, it is possible to avoid the formation of parasitic capacitance between the first branch wiring line 32α 6 and another trunk wiring line 31. Accordingly, the frame width of the glass substrate 12GS can be decreased. In addition, the second branch wiring line 32β is connected to the unit circuit 20 located farther than the unit circuit 20 connected to the first branch wiring line 32α from the end-side circuit block 30E in the Y-axis direction among the plurality of unit circuits 20 constituting the center-side circuit block 30C. Accordingly, compared to a case where the first branch wiring line and the second branch wiring line are connected to the same unit circuit 20, the disposition density of the plurality of branch wiring lines 32 decreases, and thus designing of the plurality of branch wiring lines 32 is facilitated.

The gate circuit portion 15 has a configuration in which each unit circuit 20 has a dimension in the Y-axis direction that is equal to a dimension in the Y-axis direction of each pixel PX. Accordingly, compared to a case where the dimension in the Y-axis direction is different between the unit circuit and the pixel, the routing of the gate connection wiring lines 29 connected to the unit circuits 20 and the pixels PX is simplified. Accordingly, a situation is less likely to occur in which the frame width of the glass substrate 12GS increases as a result of ensuring the routing of the gate connection wiring lines 29.

As described above, an array substrate (circuit substrate) 12 according to this embodiment includes: a glass substrate (substrate portion) 12GS having a variable-external-shape portion 12V whose external dimension in a second direction orthogonal to a first direction varies according to a position in the first direction; a gate circuit portion (circuit portion) 15 formed of a plurality of circuit blocks 30 arranged adjacent to each other in the first direction, each of the plurality of circuit blocks 30 including a plurality of unit circuits 20 arranged adjacent to each other in the first direction in the glass substrate 12GS, the gate circuit portion 15 having a configuration in which circuit blocks 30 adjacent to each other in the first direction among the plurality of circuit blocks 30 are displaced with respect to each other in the second direction in accordance with variation in the external dimension of the variable-external-shape portion 12V; a plurality of trunk wiring lines 31 that are disposed so as to be sandwiched between the gate circuit portion 15 and the variable-external-shape portion 12V in the glass substrate 12GS and that are bent along the circuit blocks 30 adjacent to each other in the first direction and displaced with respect to each other in the second direction; and a plurality of branch wiring lines 32 selectively connected to the plurality of unit circuits 20 constituting each of the plurality of circuit blocks 30 and to the plurality of trunk wiring lines 31. Among the circuit blocks 30 adjacent to each other in the first direction and displaced with respect to each other in the second direction, a circuit block 30 located closer to an end of the glass substrate 12GS in the second direction is an end-side circuit block 30E, and a circuit block 30 located closer to a center of the glass substrate 12GS in the second direction is a center-side circuit block 30C. The plurality of trunk wiring lines 31 include at least a first trunk wiring line 31α and a second trunk wiring line 31β that is disposed so as to be sandwiched between the first trunk wiring line 31α and the variable-external-shape portion 12V. Among the plurality of branch wiring lines 32, a plurality of branch wiring lines 32 connected to the plurality of unit circuits 20 constituting the center-side circuit block 30C include at least a first branch wiring line 32β 6 connected to the first trunk wiring line 31α and a second branch wiring line 32β connected to the second trunk wiring line 31β and disposed farther than the first branch wiring line 32α from the end-side circuit block 30E in the first direction.

Accordingly, signals transmitted by the plurality of trunk wiring lines 31 are supplied to the plurality of unit circuits 20 connected thereto through the plurality of branch wiring lines 32. The circuit blocks 30 constituting the gate circuit portion 15 and arranged adjacent to each other in the first direction include those displaced with respect to each other in the second direction in accordance with variation in the external dimension in the second direction of the variable-external-shape portion 12V, and thus the distances between the plurality of circuit blocks 30 and the variable-external-shape portion 12V can be maintained. In accordance with such disposition of the plurality of circuit blocks 30, the plurality of trunk wiring lines 31 are bent along the center-side circuit block 30C and the end-side circuit block 30E that are adjacent to each other in the first direction and that are displaced with respect to each other in the second direction. Thus, when the first trunk wiring line 31α and the second trunk wiring line 31β included in the plurality of trunk wiring lines 31 are compared with each other, the bent position of the first trunk wiring line 31α is closer than the bent position of the second trunk wiring line 31β to the end-side circuit block 30E in the first direction. Here, if the second branch wiring line 32β is disposed closer than the first branch wiring line 32α to the end-side circuit block 30E in the first direction, the second branch wiring line 32β overlaps the bent position of the first trunk wiring line 31α in a positional relationship, and the parasitic capacitance generated between the first trunk wiring line 31α and the second branch wiring line 32β may increase. To avoid this, it is necessary to shift the bent position of the first trunk wiring line 31α toward the end-side circuit block 30E in the first direction and to increase the space between the center-side circuit block 30C and the end-side circuit block 30E by the amount of the shift. Accordingly, the frame width in the glass substrate 12GS may increase.

In contrast to this, the second branch wiring line 32β included in the plurality of branch wiring lines 32 connected to the plurality of unit circuits 20 constituting the center-side circuit block 30C is connected to the second trunk wiring line 31β and is disposed farther than the first branch wiring line 32α 6 connected to the first trunk wiring line 31α from the end-side circuit block 30E in the first direction. Thus, the second branch wiring line 32β does not overlap the bent position of the first trunk wiring line 31α in a positional relationship, and is displaced with respect to the bent position in the direction opposite to the end-side circuit block 30E in the first direction. Accordingly, it is not necessary to shift the bent position of the first trunk wiring line 31α toward the end-side circuit block 30E in the first direction and to increase the space between the center-side circuit block 30C and the end-side circuit block 30E by the amount of the shift, and thus the frame width of the glass substrate 12GS can be kept small. This is preferable particularly in a case where the number of trunk wiring lines 31 increases or the width of the trunk wiring lines 31 increases.

The array substrate 12 also includes: a common connection trunk wiring line 33 that is disposed so as to be sandwiched between the gate circuit portion 15 and the variable-external-shape portion 12V in the glass substrate 12GS and that extends in parallel with the plurality of trunk wiring lines 31; and a plurality of common connection branch wiring lines 34 connected to the common connection trunk wiring line 33 and to all the unit circuits 20 constituting the plurality of circuit blocks 30. The plurality of trunk wiring lines 31 include a trunk wiring line 31 disposed so as to be sandwiched between the common connection trunk wiring line 33 and the variable-external-shape portion 12V. Accordingly, a signal transmitted by the common connection trunk wiring line 33 is supplied to all the unit circuits 20 constituting the circuit blocks 30 through the plurality of common connection branch wiring lines 34. Here, if all the trunk wiring lines are disposed closer than the common connection trunk wiring line 33 to the gate circuit portion 15, the individual bent positions of the individual trunk wiring lines are closer than the bent positions of the common connection trunk wiring line 33 to the end-side circuit block 30E in the first direction, and thus the common connection branch wiring lines 34 may overlap the bent positions of the individual trunk wiring lines in a positional relationship. Accordingly, the parasitic capacitance generated between the trunk wiring lines and the common connection branch wiring lines 34 may increase. To avoid this, it is necessary to shift the bent positions of the plurality of trunk wiring lines toward the end-side circuit block 30E in the first direction and to increase the space between the center-side circuit block 30C and the end-side circuit block 30E by the amount of the shift. Accordingly, the frame width in the glass substrate 12GS may increase. In contrast to this, the plurality of trunk wiring lines 31 include those sandwiched between the common connection trunk wiring line 33 and the variable-external-shape portion 12V, and thus it is possible to at least avoid the positional relationship in which the common connection branch wiring lines 34 overlap the bent position of the trunk wiring line 31 sandwiched between the common connection trunk wiring line 33 and the variable-external-shape portion 12V. Accordingly, the above-described amount of shift can be reduced in accordance with the presence of the trunk wiring line 31 sandwiched between the common connection trunk wiring line 33 and the variable-external-shape portion 12V, and the frame width in the glass substrate 12GS can be reduced.

The common connection trunk wiring line 33 is disposed closer than all the trunk wiring lines 31 to the gate circuit portion 15 in the second direction. Accordingly, it is possible to avoid the positional relationship in which the common connection branch wiring lines 34 overlap the individual bent positions of all the trunk wiring lines 31. Accordingly, it is not necessary to shift the bent positions of the plurality of trunk wiring lines 31 toward the end-side circuit block 30E in the first direction and to increase the space between the center-side circuit block 30C and the end-side circuit block 30E by the amount of the shift, and thus the frame width of the glass substrate 12GS can be kept smaller.

Among the plurality of common connection branch wiring lines 34, a plurality of common connection branch wiring lines 34 connected to the plurality of unit circuits 20 constituting the center-side circuit block 30C are disposed closer, to the end-side circuit block 30E in the first direction, than a branch wiring line 32 connected to the trunk wiring line 31 disposed so as to be sandwiched between the common connection trunk wiring line 33 and the variable-external-shape portion 12V among the plurality of branch wiring lines 32 connected to the plurality of unit circuits 20 constituting the center-side circuit block 30C. Accordingly, it is possible to avoid the positional relationship in which the branch wiring lines 32 connected to the trunk wiring line 31 sandwiched between the common connection trunk wiring line 33 and the variable-external-shape portion 12V among the branch wiring lines 32 connected to the plurality of unit circuits 20 constituting the center-side circuit block 30C overlap the bent position of the common connection trunk wiring line 33. Accordingly, it is not necessary to shift the bent position of the common connection trunk wiring line 33 toward the end-side circuit block 30E in the first direction and to increase the space between the center-side circuit block 30C and the end-side circuit block 30E by the amount of the shift, and thus the frame width of the glass substrate 12GS can be kept small.

The common connection trunk wiring line 33 transmits a power supply voltage signal VSS, and each of the plurality of common connection branch wiring lines 34 has a common positional relationship in the first direction with a corresponding branch wiring line 32 of the plurality of branch wiring lines 32, the common connection branch wiring line 34 and the corresponding branch wiring line 32 being connected to an identical one of the plurality of unit circuits 20. Accordingly, the power supply voltage signal VSS transmitted by the common connection trunk wiring line 33 is supplied to all the unit circuits 20 constituting the circuit blocks 30 through the plurality of common connection branch wiring lines 34. Compared to signals transmitted by the trunk wiring lines 31, the power supply voltage signal VSS tends to be supplied to many of the circuit elements constituting the unit circuits 20, and accordingly the routing of the common connection branch wiring lines 34 in the unit circuits 20 tends to be complicated. In contrast to this, each of the plurality of common connection branch wiring lines 34 has a common positional relationship in the first direction with the corresponding branch wiring line 32, the common connection branch wiring line 34 and the corresponding branch wiring line 32 being connected to an identical one of the unit circuits 20, and thus a common design of routing can be used. This facilitates circuit designing.

The gate circuit portion 15 has a configuration in which the plurality of unit circuits 20 constituting each of the plurality of circuit blocks 30 are linearly arranged in the first direction. Accordingly, compared to a case where a plurality of unit circuits constituting a circuit block are displaced with respect to each other in the second direction, the routing of the plurality of trunk wiring lines 31 sandwiched between the gate circuit portion 15 and the variable-external-shape portion 12V in the second direction is less likely to be complicated.

The plurality of trunk wiring lines 31 are disposed in such a manner that the first trunk wiring line 31α is located closest to the gate circuit portion 15 in the second direction, and the gate circuit portion 15 has a configuration in which a unit circuit 20 connected to the first branch wiring line 32α among the plurality of unit circuits 20 constituting the center-side circuit block 30C is located closest to the end-side circuit block 30E in the first direction. Accordingly, the bent position of the first trunk wiring line 31α among the plurality of trunk wiring lines 31 is closest to the end-side circuit block 30E in the first direction. The connection position at which the first branch wiring line 32α 6 is connected to the first trunk wiring line 31α is closest to the end-side circuit block 30E in the first direction. Thus, even if the connection position is the same as the bent position of the first trunk wiring line 31α, it is possible to avoid formation of a parasitic capacitance between the first branch wiring line 32α and another trunk wiring line 31. Accordingly, the frame width of the glass substrate 12GS can be made smaller.

The second branch wiring line 32α is connected to a unit circuit 20 located farther than a unit circuit 20 connected to the first branch wiring line 32α from the end-side circuit block 30E in the first direction among the plurality of unit circuits 20 constituting the center-side circuit block 30C. Accordingly, compared to a case where the first branch wiring line and the second branch wiring line are connected to the same unit circuit 20, the disposition density of the plurality of branch wiring lines 32 decreases, and thus the plurality of branch wiring lines 32 can be easily designed.

The array substrate 12 also includes: a display region (pixel region) AA located closer than the gate circuit portion 15 to the center in the second direction in the glass substrate 12GS, a plurality of pixels PX each serving as a display unit being disposed in the display region AA; and a plurality of gate connection wiring lines (pixel connection wiring lines) 29 disposed over the display region AA and the gate circuit portion 15 and connected to the plurality of pixels PX and the plurality of unit circuits 20. Accordingly, signals output from the unit circuits 20 are transmitted by the gate connection wiring lines 29 and thereby supplied to the pixels PX disposed in the display region AA. Accordingly, a predetermined image is displayed in the display region AA. Because the frame width outside the display region AA in the glass substrate 12GS is kept small, an excellent external appearance is achieved.

The plurality of pixels PX are disposed in such a manner that a plurality of pixels PX are arranged in the first direction and a plurality of pixels PX are arranged in the second direction, and the gate circuit portion 15 has a configuration in which each unit circuit 20 has a dimension in the first direction that is equal to a dimension in the first direction of each pixel PX. Accordingly, compared to a case were the dimension in the first direction is different between the unit circuit and the pixel, the routing of the gate connection wiring lines 29 connected to the unit circuits 20 and the pixels PX is simplified. Accordingly, a situation is less likely to occur in which the frame width of the glass substrate 12GS increases as a result of ensuring the routing of the gate connection wiring lines 29.

A liquid crystal panel (display device) 10 according to this embodiment includes: the above-described array substrate 12; and a CF substrate (counter substrate) 11 opposed to the array substrate 12. In the liquid crystal panel 10, the frame width in the array substrate 12 is small and thus the external appearance thereof is excellent.

Second Embodiment

A second embodiment will be described with reference to FIG. 7 to FIG. 9. In the second embodiment, the circuit configuration of a unit circuit 120 is different. A duplicate description will be omitted regarding the construction, function, and effect similar to those in the above-described first embodiment.

Figure 7:
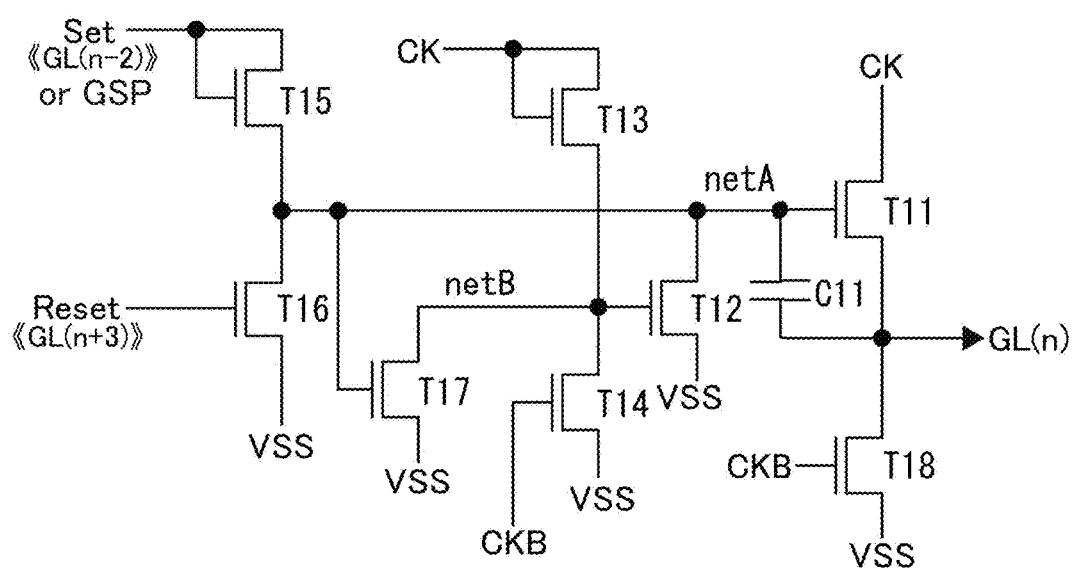
FIG. 7 is a circuit diagram illustrating the circuit configuration of a unit circuit constituting a gate circuit portion according to a second embodiment.

A specific circuit configuration of the unit circuit 120 according to this embodiment is as illustrated in FIG. 7. FIG. 7 is a circuit diagram illustrating the circuit configuration of the unit circuit 120 constituting a gate circuit portion 115. The unit circuit 120 includes eight gate circuit transistors T11 to T18 and one capacitor C11. Hereinafter, a connection wiring line that connects the gate circuit transistors T11, T12, T15, T16, and T17 and the capacitor C11 to each other will be referred to as an internal node netA. Similarly, a connection wiring line that connects the gate circuit transistors T12, T13, T14, and T17 to each other will be referred to as an internal node netB. The first gate circuit transistor T11 has a gate electrode connected to the internal node netA, a source electrode connected to an input terminal of a clock signal CK (either of clock signals CK1 and CK2), and a drain electrode connected to an output terminal of a scanning signal GL(n) in the n-th stage. The second gate circuit transistor T12 has a gate electrode connected to the internal node netB, a source electrode connected to the internal node netA, and a drain electrode connected to an input terminal of a power supply voltage signal VSS. The third gate circuit transistor T13 has a gate electrode and a source electrode connected to the input terminal of the clock signal CK (either of the clock signals CK1 and CK2) and a drain electrode connected to the internal node netB. The fourth gate circuit transistor 114 has a gate electrode connected to an input terminal of a clock signal CK (either of clock signals CK1B and CK2B), a source electrode connected to the internal node netB, and a drain electrode connected to the input terminal of the power supply voltage signal VSS. The fifth gate circuit transistor T15 has a gate electrode and a source electrode connected to an input terminal of a set signal Set or a gate start pulse signal GSP, and a drain electrode connected to the internal node netA. The sixth gate circuit transistor T16 has a gate electrode connected to an input terminal of a reset signal Reset, a source electrode connected to the internal node netA, and a drain electrode connected to the input terminal of the power supply voltage signal VSS. The seventh gate circuit transistor T17 has a gate electrode connected to the internal node netA, a source electrode connected to the internal node netB, and a drain electrode connected to the input terminal of the power supply voltage signal VSS. The eighth gate circuit transistor T18 has a gate electrode connected to the input terminal of the clock signal CK (either of the clock signals CK1B and CK2B), a source electrode connected to the output terminal of the scanning signal GL(n) in the n-th stage, and a drain electrode connected to the input terminal of the power supply voltage signal VSS. The capacitor C11 has one electrode connected to the internal node netA and the other electrode connected to the output terminal of the scanning signal GL(n) in the n-th stage.

Figure 8:
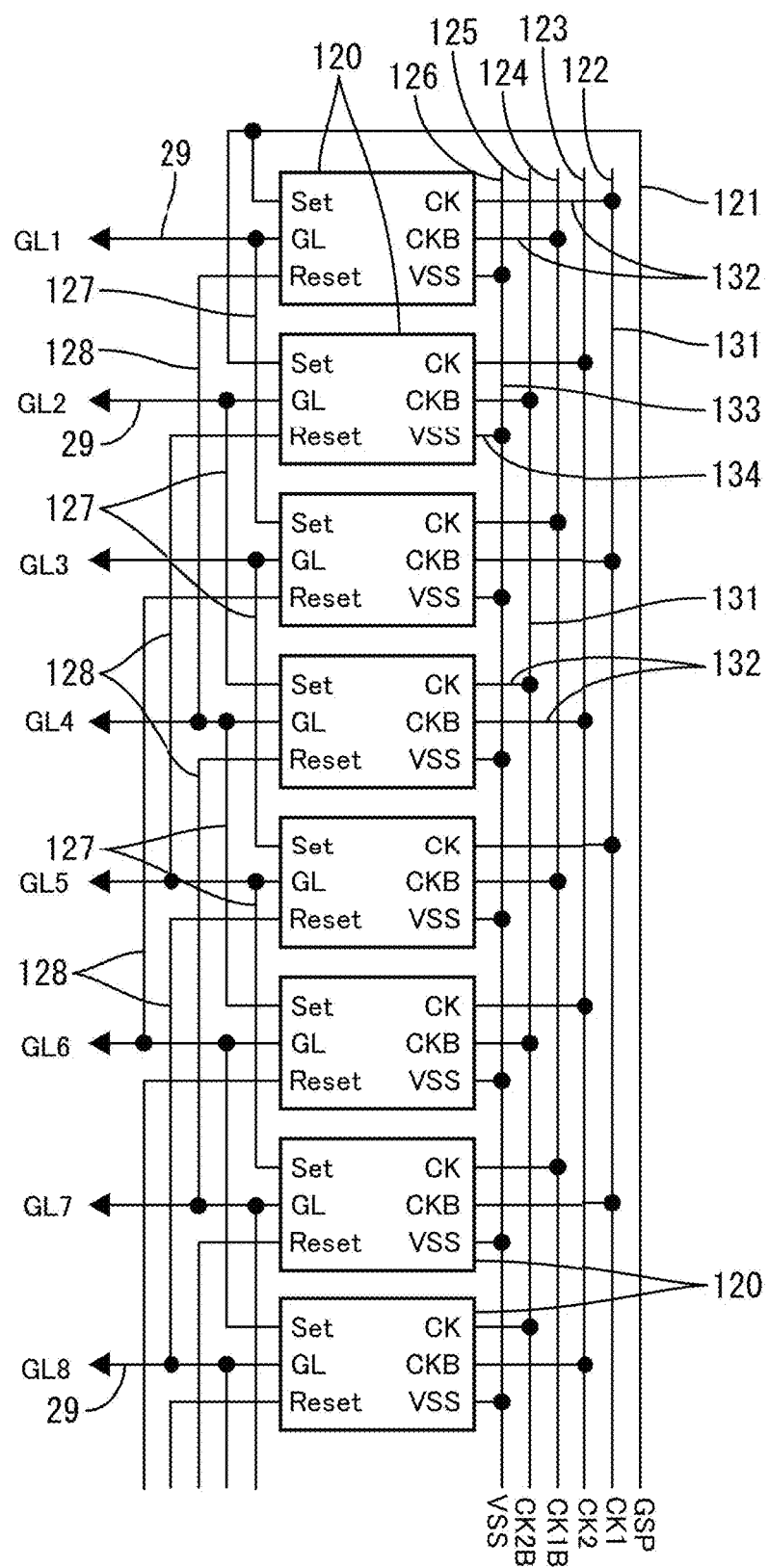
FIG. 8 is a block diagram illustrating the gate circuit portion.

FIG. 8 is a block diagram illustrating the gate circuit portion 115 that supplies scanning signals GL to gate wiring lines 116. Among wiring lines 121 to 128 connected to the gate circuit portion 115, the gate start pulse signal wiring line 121, the power supply voltage signal wiring line 126, the set signal wiring lines 127, and the reset signal wiring lines 128 are connected to destinations similar to those in the above-described first embodiment. The four clock signal wiring lines 122 to 125 whose connection destinations are different from those of the first embodiment will be described in detail. In this embodiment, two of the four clock signal wiring lines 122 to 125 are connected to one unit circuit 120. Specifically, the first clock signal wiring line 122 and the third clock signal wiring line 124 included in the clock signal wiring lines 122 to 125 are connected to the individual input terminals of the clock signals CK1 and CK1B in the unit circuits 120 in the (2n−1)-th stages, that is, odd-numbered stages, "n" being an integer that is 1 or greater, and supply the clock signals CK1 and CK1B different from each other by 180 degrees to the individual input terminals. The second clock signal wiring line 123 and the fourth clock signal wiring line 125 included in the clock signal wiring lines 122 to 125 are connected to the individual input terminals of the clock signals CK2 and CK2B in the unit circuits 120 in the (2n)-th stages, that is, even-numbered stages, "n" being an integer that is 1 or greater, and supply the clock signals CK2 and CK2B different from each other by 180 degrees to the individual input terminals.

The timing chart of the operation of the unit circuits 120 according to this embodiment is similar to that of the above-described first embodiment. With reference to FIG. 5, the difference from the first embodiment will be mainly described. As illustrated in FIG. 5, at time TI1, in each of the unit circuits 120 in the first stage and the second stage, the gate start pulse signal GSP is supplied to the gate electrode and the source electrode of the fifth gate circuit transistor T15. Accordingly, in each of the unit circuits 120 in the first stage and the second stage, the fifth gate circuit transistor T15 enters an ON-state, and a high-level potential of the gate start pulse signal GSP input to the source electrode thereof is supplied to the drain electrode. Accordingly, in each of the unit circuits 120 in the first stage and the second stage, the capacitor C11 is charged, the internal node netA is kept at a high-level potential, and the first gate circuit transistor T11 enters an ON-state. At this time, the high-level potential of the internal node netA causes the seventh gate circuit transistor T17 to be in an ON-state, and thus the internal node netB is at a low-level potential of the power supply voltage signal VSS.

Subsequently, at time TI2, the clock signal CK1 has a high-level potential. Accordingly, in the unit circuit 120 in the first stage, the high-level potential of the clock signal CK1 is supplied from the source electrode to the drain electrode of the first gate circuit transistor T11 that is in an ON-state, and thus the potential of the output terminal of the scanning signal GL increases. At this time, in the unit circuit 120 in the first stage, the potential of the internal node netA increases in accordance with the increase in the potential of the output terminal of the scanning signal GL because the capacitor C11 is provided between the internal node netA and the output terminal of the scanning signal GL. That is, the potential of the internal node netA is raised. Accordingly, in the unit circuit 120 in the first stage, the gate electrode of the first gate circuit transistor T11 is at a higher potential, and thus the potential of the output terminal of the scanning signal GL reaches the high-level potential of the clock signal CK1. Accordingly, the scanning signal GL1 at a high level is supplied to the gate wiring line 116 in the first stage. At this time, the scanning signal GL1 output to the output terminal of the scanning signal GL in the unit circuit 120 in the first stage is supplied as a set signal Set to the input terminal of the set signal Set in the unit circuit 120 in the third stage. Accordingly, in the unit circuit 120 in the third stage, the set signal Set is supplied to the gate electrode and the source electrode of the fifth gate circuit transistor T15. Thus, the capacitor C11 is charged, the internal node netA is kept at a high-level potential, and the first gate circuit transistor T11 enters an ON-state. On the other hand, when the clock signal CK1 has a high-level potential, the third gate circuit transistor T13 in the unit circuit 120 in the first stage is in an ON-state, and the high-level potential of the clock signal CK1 input to the source electrode thereof is supplied to the drain electrode. However, when the internal node netA is at a high-level potential, the seventh gate circuit transistor T17 is in an ON-state, and thus the internal node netB is at a low-level potential of the power supply voltage signal VSS.

Subsequently, at time TI3, the clock signal CK2 has a high-level potential. Accordingly, in the unit circuit 120 in the second stage, the high-level potential of the clock signal CK2 is supplied from the source electrode to the drain electrode of the first gate circuit transistor T11 that is in an ON-state, and thus the potential of the output terminal of the scanning signal GL increases. At this time, in the unit circuit 120 in the second stage, the potential of the internal node netA is raised, and thus the potential of the output terminal of the scanning signal GL reaches the high-level potential of the clock signal CK2. Accordingly, the scanning signal GL2 at a high level is supplied to the gate wiring line 116 in the second stage. At this time, the scanning signal GL2 output to the output terminal of the scanning signal GL in the unit circuit 120 in the second stage is supplied as a set signal Set to the input terminal of the set signal Set in the unit circuit 120 in the fourth stage.

Subsequently, at time TI4, the clock signal CK1 has a low-level potential and the clock signal CK1B has a high-level potential. The low-level potential of the clock signal CK1 causes the potential of the internal node netA to be raised in the unit circuit 120 in the first stage, and thus the output terminal of the scanning signal GL is at a low-level potential. In contrast to this, when the clock signal CK1B has a high-level potential, the gate circuit transistors 114 and T18 are in an ON-state in the unit circuit 120 in the first stage. Accordingly, the potential of the output terminal of the scanning signal GL and the internal node netB are at the low-level potential of the power supply voltage signal VSS.

Subsequently, at time TI5, the clock signal CK2 has a low-level potential and the clock signal CK2B has a high-level potential. The low-level potential of the clock signal CK2 causes the potential of the internal node netA to be raised in the unit circuit 120 in the second stage, and thus the output terminal of the scanning signal GL is at a low-level potential. In contrast to this, when the clock signal CK2B has a high-level potential, the gate circuit transistors T14 and T18 are in an ON-state in the unit circuit 120 in the second stage. Accordingly, the potential of the output terminal of the scanning signal GL and the internal node netB are at the low-level potential of the power supply voltage signal VSS.

After that, the clock signal CK1B has a low-level potential and the clock signal CK1 has a high-level potential. When the clock signal CK1B has a low-level potential, the gate circuit transistors T14 and T18 are in an OFF-state in the unit circuit 120 in the first stage. In contrast to this, when the clock signal CK1 has a high-level potential, in the unit circuit 120 in the third stage, the high-level potential of the clock signal CK1 is supplied from the source electrode to the drain electrode of the first gate circuit transistor T11 that is in an ON-state, and thus the potential of the output terminal of the scanning signal GL increases. At this time, in the unit circuit 120 in the third stage, the potential of the internal node netA is raised, and thus the potential of the output terminal of the scanning signal GL reaches the high-level potential of the clock signal CK1. Accordingly, the scanning signal GL3 at a high level is supplied to the gate wiring line 116 in the third stage. At this time, the scanning signal GL3 output to the output terminal of the scanning signal GL in the unit circuit 120 in the third stage is supplied as a set signal Set to the input terminal of the set signal Set in the unit circuit 120 in the fifth stage.

Subsequently, the clock signal CK2B has a low-level potential and the clock signal CK2 has a high-level potential. When the clock signal CK2B has a low-level potential, the gate circuit transistors 114 and T18 are in an OFF-state in the unit circuit 120 in the second stage. In contrast to this, when the clock signal CK2 has a high-level potential, in the unit circuit 120 in the fourth stage, the high-level potential of the clock signal CK2 is supplied from the source electrode to the drain electrode of the first gate circuit transistor T11 that is in an ON-state, and thus the potential of the output terminal of the scanning signal GL increases. At this time, in the unit circuit 120 in the fourth stage, the potential of the internal node netA is raised, and thus the potential of the output terminal of the scanning signal GL reaches the high-level potential of the clock signal CK2. Accordingly, the scanning signal GL4 at a high level is supplied to the gate wiring line 116 in the fourth stage. At this time, the scanning signal GL4 output to the output terminal of the scanning signal GL in the unit circuit 120 in the fourth stage (n-th stage) is supplied as a set signal Set to the input terminal of the set signal Set in the unit circuit 120 in the sixth stage (n+2-th stage), and is also supplied as a reset signal Reset to the input terminal of the reset signal Reset in the unit circuit 120 in the first stage (n−3-th stage). Accordingly, in the unit circuit 120 in the first stage, the power supply voltage signal VSS is supplied from the source electrode to the drain electrode of the sixth gate circuit transistor T16, and thus the internal node netA is at the low-level potential of the power supply voltage signal VSS.

As described above, in a non-selection period in which the clock signal CK (either of the clock signals CK1 and CK2) is not supplied to the unit circuit 120, the clock signal CKB (either of the clock signals CK1B and CK2B) having a phase opposite to that of the clock signal CK is supplied to the gate circuit transistors T14 and T18, and accordingly the low-level potential of the power supply voltage signal VSS is periodically supplied to the output terminal of the scanning signal GL. Accordingly, the potential of the output terminal of the scanning signal GL is stabilized in the non-selection period. Furthermore, regarding noise caused by a change in the clock signal CK during the non-selection period, the internal node netB stabilizes the internal node netA.

Next, a description will be given of the routing of the clock signal wiring lines 122 to 125 near a variable-external-shape portion 112V with reference to FIG. 9. FIG. 9 is a plan view schematically illustrating the configuration of the vicinity of the variable-external-shape portion 112V in an array substrate 112. In FIG. 9, the gate start pulse signal wiring line 121, the set signal wiring lines 127, and the reset signal wiring lines 128 are not illustrated because the space is limited. In this embodiment, four trunk wiring lines 131 constituting the clock signal wiring lines 122 to 125 are aligned so as to be arranged in the order of, from the vicinity of the display region AA in the X-axis direction, the trunk wiring line 131 of the second clock signal wiring line 123, the trunk wiring line 131 of the fourth clock signal wiring line 125, the trunk wiring line 131 of the first clock signal wiring line 122, and the trunk wiring line 131 of the third clock signal wiring line 124, as illustrated in FIG. 9. Eight branch wiring lines 132 in total, which communicate with the four trunk wiring lines 131 and each two of which are connected to one of the unit circuits 120 constituting a center-side circuit clock 130C, are aligned so as to be arranged in the order of, from the vicinity of an end-side circuit block 130E in the Y-axis direction (the lower side in FIG. 9), the branch wiring line 132 of the second clock signal wiring line 123, the branch wiring line 132 of the fourth clock signal wiring line 125, the branch wiring line 132 of the first clock signal wiring line 122, the branch wiring line 132 of the third clock signal wiring line 124, the branch wiring line 132 of the fourth clock signal wiring line 125, the branch wiring line 132 of the second clock signal wiring line 123, the branch wiring line 132 of the third clock signal wiring line 124, and the branch wiring line 132 of the first clock signal wiring line 122. The alignment of the branch wiring lines 132 is common to all the circuit blocks 130.

The four unit circuits 120 constituting the center-side circuit block 130C are aligned so as to be arranged in the order of, from the vicinity of the end-side circuit block 130E in the Y-axis direction, the unit circuit 120 in the (4n)-th stage connected to the branch wiring line 132 of the second clock signal wiring line 123 and the branch wiring line 132 of the fourth clock signal wiring line 125, the unit circuit 120 in the (4n−1)-th stage connected to the branch wiring line 132 of the first clock signal wiring line 122 and the branch wiring line 132 of the third clock signal wiring line 124, the unit circuit 120 in the (4n−2)-th stage connected to the branch wiring line 132 of the second clock signal wiring line 123 and the branch wiring line 132 of the fourth clock signal wiring line 125, and the unit circuit 120 in the (4n−3)-th stage connected to the branch wiring line 132 of the first clock signal wiring line 122 and the branch wiring line 132 of the third clock signal wiring line 124. Regarding the power supply voltage signal wiring line 126, as in the above-described first embodiment, a common connection trunk wiring line 133 is disposed closer than all the trunk wiring lines 131 to the gate circuit portion 115 in the X-axis direction, and common connection branch wiring lines 134 are each disposed closer than the two branch wring lines 132 connected to one of the unit circuits 120 constituting the center-side circuit block 130C to the end-side circuit block 130E in the Y-axis direction.

Figure 9:
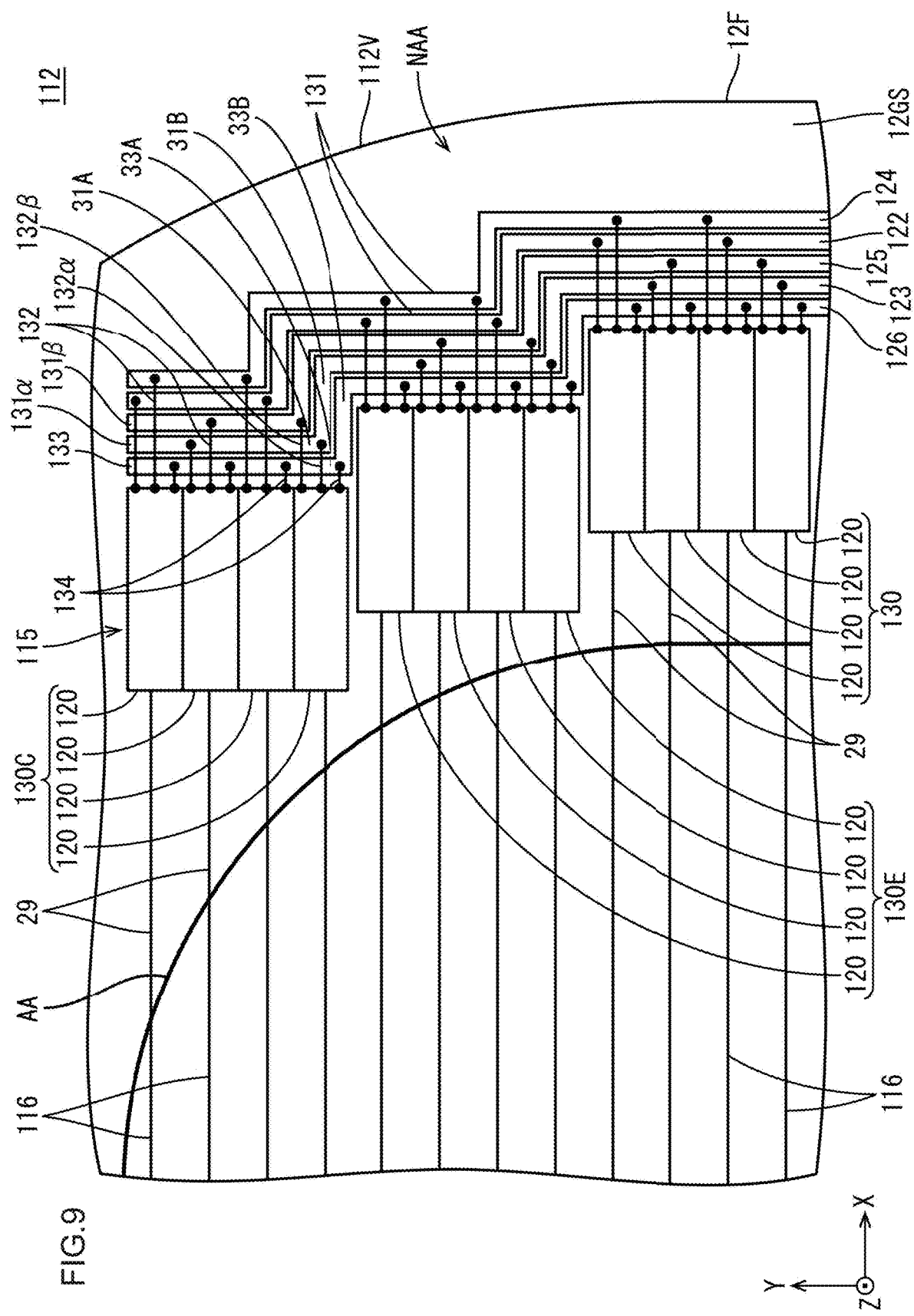
FIG. 9 is a plan view illustrating unit circuits in an array substrate and various wiring lines connected to the unit circuits.

As described above, the plurality of branch wiring lines 132 connected to the plurality of unit circuits 120 constituting the center-side circuit block 130C in this embodiment include, as illustrate din FIG. 9, at least a first branch wiring line 132α that is connected to a first trunk wiring line 131α located closer than a second trunk wiring line 131β to the display region AA, and a second branch wiring line 132β that is connected to the second trunk wiring line 131β located closer than the first trunk wiring line 131α to the variable-external-shape portion 112V and that is disposed farther than the first branch wiring line 132α from the end-side circuit block 130E in the Y-axis direction. Accordingly, the frame width of the array substrate 112 can be decreased as in the above-described first embodiment. The first branch wiring line 132α and the second branch wiring line 132β are connected to the same unit circuit 120 included in the plurality of unit circuits 120 constituting the center-side circuit block 130C. With this configuration, although the disposition density of the plurality of branch wiring lines 132 increases compared to the above-described first embodiment, the manner of supplying individual signals transmitted to the plurality of unit circuits 120 constituting the center-side circuit block 130C by the plurality of trunk wiring lines 131 can be diversified. This is preferable in a case where the circuit block 130 has a complicated circuit configuration.

As described above, according to this embodiment, the first branch wiring line 132α and the second branch wiring line 132β are connected to the same unit circuit 120 included in the plurality of unit circuits 120 constituting the center-side circuit block 130C. Accordingly, although the disposition density of the plurality of branch wiring lines 132 increases compared to a case where the first branch wiring line and the second branch wiring line are connected to different unit circuits 120, the manner of supplying individual signals transmitted to the plurality of unit circuits 120 constituting the center-side circuit block 130C by the plurality of trunk wiring lines 131 can be diversified. This is preferable in a case where the circuit block 130 has a complicated circuit configuration.

Third Embodiment

Figure 10:
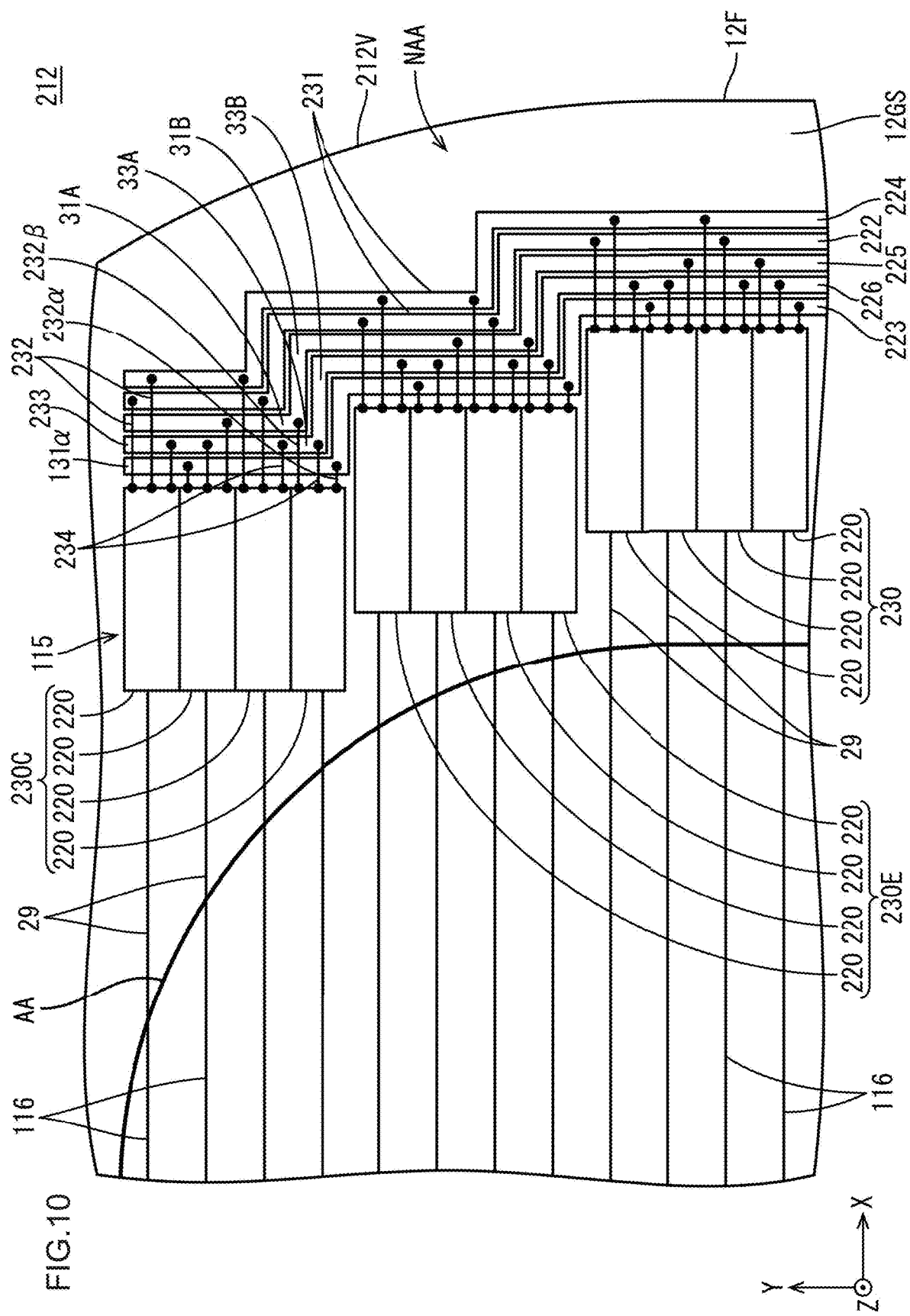
FIG. 10 is a plan view illustrating unit circuits in an array substrate and various wiring lines connected to the unit circuits according to a third embodiment.

A third embodiment will be described with reference to FIG. 10. The third embodiment is different from the above-described second embodiment in the disposition of a second clock signal wiring line 223 and a power supply voltage signal wiring line 226, and so forth. A duplicate description will be omitted regarding the structure, function, and effect similar to those in the above-described second embodiment.

The routing of clock signal wiring lines 222 to 225 and the power supply voltage signal wiring line 226 near a variable-external-shape portion 212V according to this embodiment will be described with reference to FIG. 10. FIG. 10 is a plan view schematically illustrating the configuration of the vicinity of the variable-external-shape portion 212V in an array substrate 212. In FIG. 10, the gate start pulse signal wiring line, the set signal wiring lines, and the reset signal wiring lines are not illustrated because the space is limited. In this embodiment, four trunk wiring lines 231 constituting the clock signal wiring lines 222 to 225 and one common connection trunk wiring line 233 constituting the power supply voltage signal wiring line 226 are aligned so as to be arranged in the order of, from the vicinity of the display region AA in the X-axis direction, the trunk wiring line 231 of the second clock signal wiring line 223, the common connection trunk wiring line 233, the trunk wiring line 231 of the fourth clock signal wiring line 225, the trunk wiring line 231 of the first clock signal wiring line 222, and the trunk wiring line 231 of the third clock signal wiring line 224, as illustrated in FIG. 10.

Eight branch wiring lines 232 in total, which communicate with the four trunk wiring lines 231 and each two of which are connected to one of unit circuits 220 constituting a center-side circuit clock 230C, and common connection branch wiring lines 234 constituting the power supply voltage signal wiring line 226 are aligned so as to be arranged in the order of, from the vicinity of an end-side circuit block 230E in the Y-axis direction (the lower side in FIG. 10), the branch wiring line 232 of the second clock signal wiring line 223, the common connection branch wiring line 234, the branch wiring line 232 of the fourth clock signal wiring line 225, the common connection branch wiring line 234, the branch wiring line 232 of the first clock signal wiring line 222, the branch wiring line 232 of the third clock signal wiring line 224, the branch wiring line 232 of the fourth clock signal wiring line 225, the common connection branch wiring line 234, the branch wiring line 232 of the second clock signal wiring line 223, the common connection branch wiring line 234, the branch wiring line 232 of the third clock signal wiring line 224, and the branch wiring line 232 of the first clock signal wiring line 222. The alignment of the branch wiring lines 232 and the common connection branch wiring lines 234 is common to all the circuit blocks 230. In this embodiment, although the common connection branch wiring line 234 may be interposed between a first branch wiring line 232α and a second branch wiring line 232β in the Y-axis direction, the frame width of the array substrate 212 can be decreased as in the above-described first and second embodiments.

Fourth Embodiment

Figure 11:
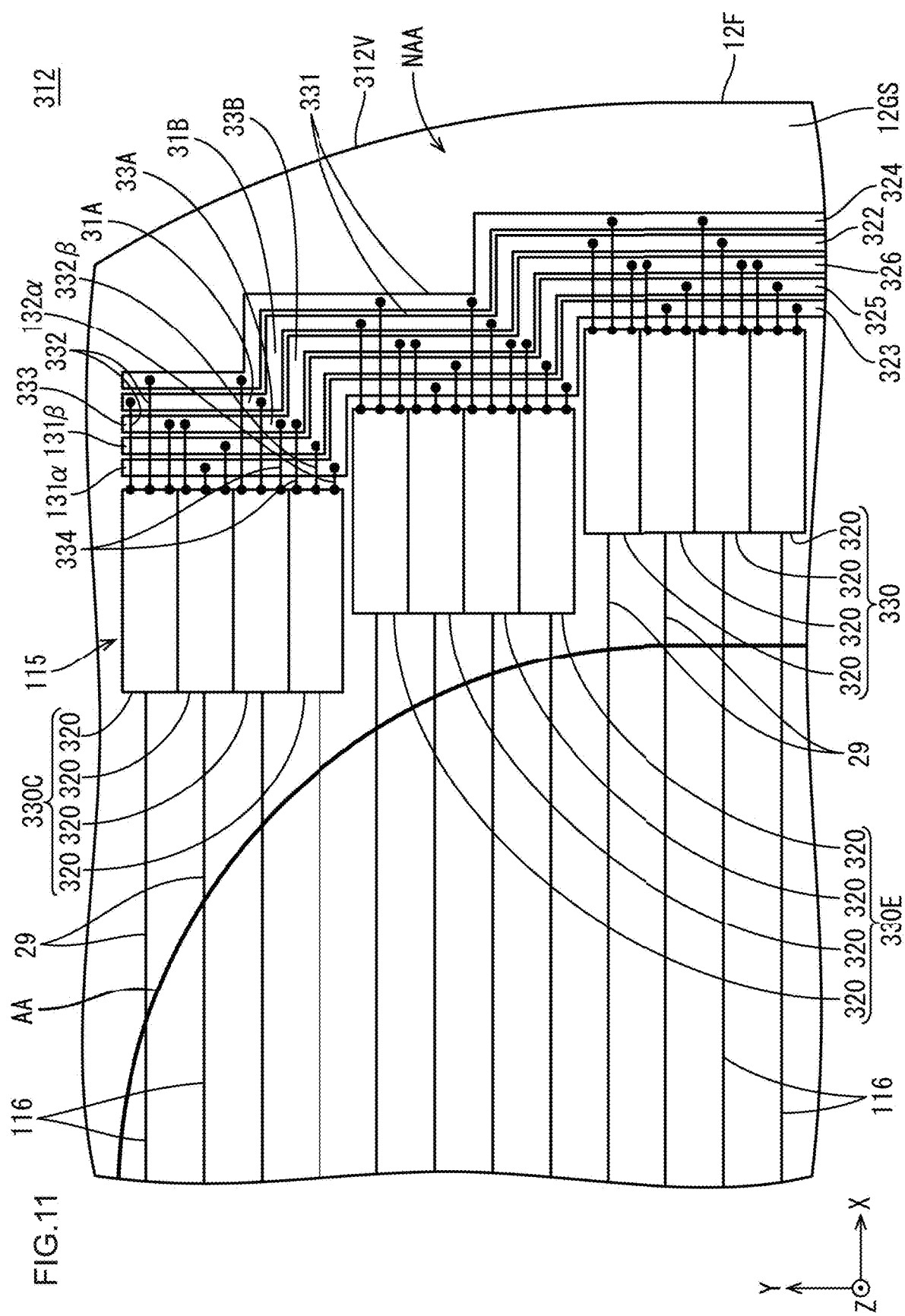
FIG. 11 is a plan view illustrating unit circuits in an array substrate and various wiring lines connected to the unit circuits according to a fourth embodiment.

A fourth embodiment will be described with reference to FIG. 11. The fourth embodiment is different from the above-described second embodiment in the disposition of a second clock signal wiring line 323, a fourth clock signal wiring line 325, and a power supply voltage signal wiring line 326, and so forth. A duplicate description will be omitted regarding the structure, function, and effect similar to those in the above-described second embodiment.

The routing of clock signal wiring lines 322 to 325 and the power supply voltage signal wiring line 326 near a variable-external-shape portion 312V according to this embodiment will be described with reference to FIG. 11. FIG. 11 is a plan view schematically illustrating the configuration of the vicinity of the variable-external-shape portion 312V in an array substrate 312. In FIG. 11, the gate start pulse signal wiring line, the set signal wiring lines, and the reset signal wiring lines are not illustrated because the space is limited. In this embodiment, four trunk wiring lines 331 constituting the clock signal wiring lines 322 to 325 and one common connection trunk wiring line 333 constituting the power supply voltage signal wiring line 326 are aligned so as to be arranged in the order of, from the vicinity of the display region AA in the X-axis direction, the trunk wiring line 331 of the second clock signal wiring line 323, the trunk wiring line 331 of the fourth clock signal wiring line 325, the common connection trunk wiring line 333, the trunk wiring line 331 of the first clock signal wiring line 322, and the trunk wiring line 331 of the third clock signal wiring line 324, as illustrated in FIG. 11.

Eight branch wiring lines 332 in total, which communicate with the four trunk wiring lines 331 and each two of which are connected to one of unit circuits 320 constituting a center-side circuit clock 330C, and common connection branch wiring lines 334 constituting the power supply voltage signal wiring line 326 are aligned so as to be arranged in the order of, from the vicinity of an end-side circuit block 330E in the Y-axis direction (the lower side in FIG. 11), the branch wiring line 332 of the second clock signal wiring line 323, the branch wiring line 332 of the fourth clock signal wiring line 325, the common connection branch wiring line 334, the common connection branch wiring line 334, the branch wiring line 332 of the first clock signal wiring line 322, the branch wiring line 332 of the third clock signal wiring line 324, the branch wiring line 332 of the fourth clock signal wiring line 325, the branch wiring line 332 of the second clock signal wiring line 323, the common connection branch wiring line 334, the common connection branch wiring line 334, the branch wiring line 332 of the third clock signal wiring line 324, and the branch wiring line 332 of the first clock signal wiring line 322. The alignment of the branch wiring lines 332 and the common connection branch wiring lines 334 is common to all the circuit blocks 330. In this embodiment, although the common connection branch wiring line 334 may be disposed farther than a second branch wiring line 332β from the end-side circuit block 330E in the Y-axis direction, the frame width of the array substrate 312 can be decreased as in the above-described first and second embodiments.

Other Embodiments

The techniques disclosed in this description are not limited to the embodiments described by using the above description and the drawings. The following embodiments, for example, are also included in the technical scope.

(1) The specific routing of the trunk wiring lines 31, 131, 231, and 331 can be changed as appropriate. For example, at least one or some of the trunk wiring lines 31, 131, 231, and 331 may extend in a direction slanting with respect to both the X-axis direction and the Y-axis direction. The bending angles of the bent portions of the trunk wiring lines 31, 131, 231, and 331 are not limited to right angles and can be changed as appropriate.

(2) The specific routing of the branch wiring lines 32, 132, 232, and 332 can be changed as appropriate. For example, at least one or some of the branch wiring lines 32, 132, 232, and 332 may extend in a direction slanting with respect to both the X-axis direction and the Y-axis direction or may extend in the Y-axis direction. In short, the branch wiring lines 32, 132, 232, and 332 do not necessarily need to linearly extend in the X-axis direction.

(3) The specific alignment of the trunk wiring lines 31, 131, 231, and 331 of the clock signal wiring lines 22 to 25, 122 to 125, 222 to 225, and 322 to 325, and the common connection trunk wiring lines 33, 133, 233, and 333 of the power supply voltage signal wiring lines 26, 126, 226, and 326 can be changed as appropriate.

(4) In the configuration described in the first embodiment, the specific alignment of the branch wiring lines 32 communicating with the four trunk wiring lines 31 and connected to the individual unit circuits 20 constituting the center-side circuit block 30C can be changed as appropriate.

(5) As a modification example of the second to fourth embodiments, the branch wiring lines 132, 232, and 332 communicating with the four trunk wiring lines 131, 231, and 331 and connected to the individual unit circuits 120, 220, and 320 constituting the center-side circuit blocks 130C, 230C, and 330C may be aligned so as to be arranged in the order of, from the vicinity of the end-side circuit blocks 130E, 230E, and 330E in the Y-axis direction, the branch wiring lines 132, 232, and 332 of the second clock signal wiring lines 123, 223, and 323, the branch wiring lines 132, 232, and 332 of the fourth clock signal wiring lines 125, 225, and 325, the branch wiring lines 132, 232, and 332 of the first clock signal wiring lines 122, 222, and 322, and the branch wiring lines 132, 232, and 332 of the third clock signal wiring lines 124, 224, and 324, which is repeated twice. Other than this, in the configurations described in the second to fourth embodiments, the specific alignment of the branch wiring lines 132, 232, and 332 can be changed as appropriate.

(6) The plurality of unit circuits 20, 120, 220, and 32β constituting the circuit blocks 30, 130, 230, and 330 may be aligned so as to be arranged in a direction slanting with respect to the Y-axis direction.

(7) The specific number of unit circuits 20, 120, 220, and 320 constituting the circuit blocks 30, 130, 230, and 330 is not limited to four and can be changed as appropriate.

(8) The specific number of clock signal wiring lines 22 to 25, 122 to 125, 222 to 225, and 322 to 325 to be installed and the specific number of trunk wiring lines 31, 131, 231, and 331 to be installed are not limited to four and can be changed as appropriate.

(9) The number of clock signal wiring lines 22 to 25, 122 to 125, 222 to 225, and 322 to 325 and the number of unit circuits 20, 120, 220, and 320 constituting the circuit blocks 30, 130, 230, and 330 may be unequal to each other.

(10) The specific number of branch wiring lines 32, 132, 232, and 332 connected to one unit circuit 20, 120, 220, and 320 can be changed to three or more.

(11) The specific formation range of the unit circuits 20, 120, 220, and 32β is not limited to a laterally-elongated substantially rectangular shape schematically illustrated in each figure, and can be changed as appropriate.

(12) The specific circuit configuration (the number and type of circuit elements) of the unit circuits 20, 120, 220, and 32β can be changed as appropriate.

(13) The dimension in the Y-axis direction of the unit circuits 20, 120, 220, and 320 may be different from the dimension in the Y-axis direction of the pixels PX.

(14) The driver 13 may be chip on film (COF)-mounted on a flexible substrate that is film on glass (FOG)-mounted on the array substrates 12, 112, 212, and 312. In this case, the clock signal wiring lines 22 to 25, 122 to 125, 222 to 225, and 322 to 325, the power supply voltage signal wiring lines 26, 126, 226, and 326, and so forth are supplied with various signals from the mount region of the flexible substrate in the array substrates 12, 112, 212, and 312.

(15) The gate circuit portions 15 and 115 may be a pair of gate circuit portions sandwiching the display region AA from both sides in the X-axis direction.

(16) The specific planar shapes of the liquid crystal panel 10, the array substrates 12, 112, 212, and 312, and the display region AA can be changed as appropriate, and may be, for example, a laterally-elongated substantially rectangular shape, a substantially square shape, a triangular shape, a trapezoidal shape, an inverted trapezoidal shape, a circular shape, an oval shape, a gourd shape, or the like in plan view. It is allowed that the fixed-external-shape portion 12F is not included in the external shape of the glass substrate 12GS as a result of changing the planar shape of the array substrates 12, 112, 212, and 312. Among the four corner portions in the array substrates 12, 112, 212, and 312 that are substantially rectangular shaped, two corner portions located on one side in the short-side direction may be rounded. Alternatively, among the four corner portions in the array substrates 12, 112, 212, and 312 that are substantially rectangular shaped, one corner portion may be rounded. Alternatively, among the four corner portions in the array substrates 12, 112, 212, and 312 that are substantially rectangular shaped, three corner portions may be rounded. Alternatively, among the four corner portions in the array substrates 12, 112, 212, and 312 that are substantially rectangular shaped, all the four corner portions may be rounded.

(17) The liquid crystal panel 10 may be of a reflective type or a semi-transmissive type that performs display by using external light, other than a transmissive type.

(18) A display panel of a type other than the liquid crystal panel 10 (an organic EL panel, an EPD (a microcapsule electrophoretic display panel), MEMS (Micro Electro Mechanical Systems) display panel, or the like) may be used.

While there have been described what are at present considered to be certain embodiments of the application, it will be understood that various modifications may be made thereto, and it is intended that the appended claim cover all such modifications as fall within the true spirit and scope of the application.

What is claimed is:

1. A circuit substrate comprising:
a substrate portion having a variable-external-shape portion whose external dimension in a second direction orthogonal to a first direction varies according to a position in the first direction;
a circuit portion formed of a plurality of circuit blocks arranged adjacent to each other in the first direction, each of the plurality of circuit blocks including a plurality of unit circuits arranged adjacent to each other in the first direction in the substrate portion, the circuit portion having a configuration in which circuit blocks adjacent to each other in the first direction among the plurality of circuit blocks are displaced with respect to each other in the second direction in accordance with variation in the external dimension of the variable-external-shape portion;
a plurality of trunk wiring lines that are disposed so as to be sandwiched between the circuit portion and the variable-external-shape portion in the substrate portion and that are bent along the circuit blocks adjacent to each other in the first direction and displaced with respect to each other in the second direction;
a plurality of branch wiring lines selectively connected to the plurality of unit circuits constituting each of the plurality of circuit blocks and to the plurality of trunk wiring lines;
a common connection trunk wiring line that is disposed so as to be sandwiched between the circuit portion and the variable-external-shape portion in the substrate portion and that extends in parallel with the plurality of trunk wiring lines; and
a plurality of common connection branch wiring lines connected to the common connection trunk wiring line and to all the unit circuits constituting the plurality of circuit blocks, wherein
among the circuit blocks adjacent to each other in the first direction and displaced with respect to each other in the second direction, a circuit block located closer to an end of the substrate portion in the second direction is an end-side circuit block, and a circuit block located closer to a center of the substrate portion in the second direction is a center-side circuit block,
the plurality of trunk wiring lines include at least a first trunk wiring line and a second trunk wiring line that is disposed so as to be sandwiched between the first trunk wiring line and the variable-external-shape portion,
among the plurality of branch wiring lines, a plurality of branch wiring lines connected to the plurality of unit circuits constituting the center-side circuit block include at least a first branch wiring line connected to the first trunk wiring line and a second branch wiring line connected to the second trunk wiring line and disposed farther than the first branch wiring line from the end-side circuit block in the first direction,
the plurality of trunk wiring lines include a trunk wiring line disposed so as to be sandwiched between the common connection trunk wiring line and the variable-external-shape portion, and
among the plurality of common connection branch wiring lines, a plurality of common connection branch wiring lines connected to the plurality of unit circuits constituting the center-side circuit block are disposed closer, to the end-side circuit block in the first direction, than a branch wiring line connected to the trunk wiring line disposed so as to be sandwiched between the common connection trunk wiring line and the variable-external-shape portion among the plurality of branch wiring lines connected to the plurality of unit circuits constituting the center-side circuit block.

2. The circuit substrate according to claim 1, wherein the common connection trunk wiring line is disposed closer than all the trunk wiring lines to the circuit portion in the second direction.

3. The circuit substrate according to claim 1, wherein the common connection trunk wiring line transmits a power supply voltage signal, and each of the plurality of common connection branch wiring lines has a common positional relationship in the first direction with a corresponding branch wiring line of the plurality of branch wiring lines, the common connection branch wiring line and the corresponding branch wiring line being connected to an identical one of the plurality of unit circuits.

4. The circuit substrate according to claim 1, wherein the circuit portion has a configuration in which the plurality of unit circuits constituting each of the plurality of circuit blocks are linearly arranged in the first direction.

5. The circuit substrate according to claim 1, wherein
the plurality of trunk wiring lines are disposed in such a manner that the first trunk wiring line is located closest to the circuit portion in the second direction, and
the circuit portion has a configuration in which a unit circuit connected to the first branch wiring line among the plurality of unit circuits constituting the center-side circuit block is located closest to the end-side circuit block in the first direction.

6. The circuit substrate according to claim 1, wherein the second branch wiring line is connected to a unit circuit located farther than a unit circuit connected to the first branch wiring line from the end-side circuit block in the first direction among the plurality of unit circuits constituting the center-side circuit block.

7. The circuit substrate according to claim 1, wherein the first branch wiring line and the second branch wiring line are connected to an identical unit circuit included in the plurality of unit circuits constituting the center-side circuit block.

8. The circuit substrate according to claim 1, comprising:
a pixel region located closer than the circuit portion to the center in the second direction in the substrate portion, a plurality of pixels each serving as a display unit being disposed in the pixel region; and
a plurality of pixel connection wiring lines disposed over the pixel region and the circuit portion and connected to the plurality of pixels and the plurality of unit circuits.

9. The circuit substrate according to claim 8, wherein
the plurality of pixels are disposed in such a manner that a plurality of pixels are arranged in the first direction and a plurality of pixels are arranged in the second direction, and
the circuit portion has a configuration in which each unit circuit has a dimension in the first direction that is equal to a dimension in the first direction of each pixel.

10. A display device comprising:
the circuit substrate according to claim 1; and
a counter substrate opposed to the circuit substrate.

* * * * *